(12) United States Patent
Kobayashi

(10) Patent No.: US 10,804,310 B2
(45) Date of Patent: Oct. 13, 2020

(54) PHOTOELECTRIC CONVERSION DEVICE AND IMAGING SYSTEM

(71) Applicant: CANON KABUSHIKI KAISHA, Tokyo (JP)

(72) Inventor: Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/267,933

(22) Filed: Feb. 5, 2019

(65) Prior Publication Data

US 2019/0252443 A1 Aug. 15, 2019

(30) Foreign Application Priority Data

Feb. 9, 2018 (JP) .................. 2018-022022

(51) Int. Cl.
| H01L 27/146 | (2006.01) |
| H04N 5/378 | (2011.01) |
| H04N 5/374 | (2011.01) |
| H04N 5/369 | (2011.01) |

(52) U.S. Cl.
CPC .. *H01L 27/14634* (2013.01); *H01L 27/14607* (2013.01); *H01L 27/14636* (2013.01); *H04N 5/369* (2013.01); *H04N 5/374* (2013.01); *H04N 5/378* (2013.01); *H04N 5/379* (2018.08); *H01L 27/1464* (2013.01)

(58) Field of Classification Search
CPC .......... H04N 5/335–378; H04N 5/374–37457; H01L 27/146–14893; H01L 27/14643–14663; H01L 2225/06503–06596
See application file for complete search history.

(56) References Cited

U.S. PATENT DOCUMENTS

| 2008/0042046 A1* | 2/2008 | Mabuchi | ........... H01L 27/14634 250/208.1 |
| 2013/0092820 A1* | 4/2013 | Takemoto | .............. H04N 5/369 250/208.1 |
| 2013/0107075 A1* | 5/2013 | Kobayashi | ........ H01L 27/14636 348/222.1 |
| 2013/0250151 A1* | 9/2013 | Kato | ...................... H04N 5/335 348/300 |

(Continued)

FOREIGN PATENT DOCUMENTS

JP 2012-33894 A 2/2012

*Primary Examiner* — Abdelaaziz Tissire

(74) *Attorney, Agent, or Firm* — Canon U.S.A., Inc. IP Division

(57) ABSTRACT

A photoelectric conversion device according to one embodiment includes a first wiring structure disposed on a first semiconductor layer and a second semiconductor layer disposed on a second wiring structure. The first wiring structure has a first connection part and a third connection part. The second wiring structure has a second connection part and a fourth connection part. The first connection part and the second connection part are in contact at a junction interface, and the third connection part and the fourth connection part are also in contact at the junction interface. In a planar view, the area of at least one of the first connection part and the second connection part is different from the area of at least one of the third connection part and the fourth connection part.

23 Claims, 24 Drawing Sheets

(56) References Cited

U.S. PATENT DOCUMENTS

| | | | |
|---|---|---|---|
| 2013/0320197 A1* | 12/2013 | Asayama | H01L 25/167 |
| | | | 250/208.1 |
| 2014/0091414 A1* | 4/2014 | Shimotsusa | H01L 21/76898 |
| | | | 257/431 |
| 2016/0182781 A1* | 6/2016 | Mabuchi | H03M 1/144 |
| | | | 348/322 |
| 2017/0092680 A1* | 3/2017 | Kwon | H04N 5/2253 |
| 2017/0207158 A1* | 7/2017 | Kang | H01L 24/92 |
| 2017/0278214 A1* | 9/2017 | Terashima | G05D 1/0246 |

* cited by examiner

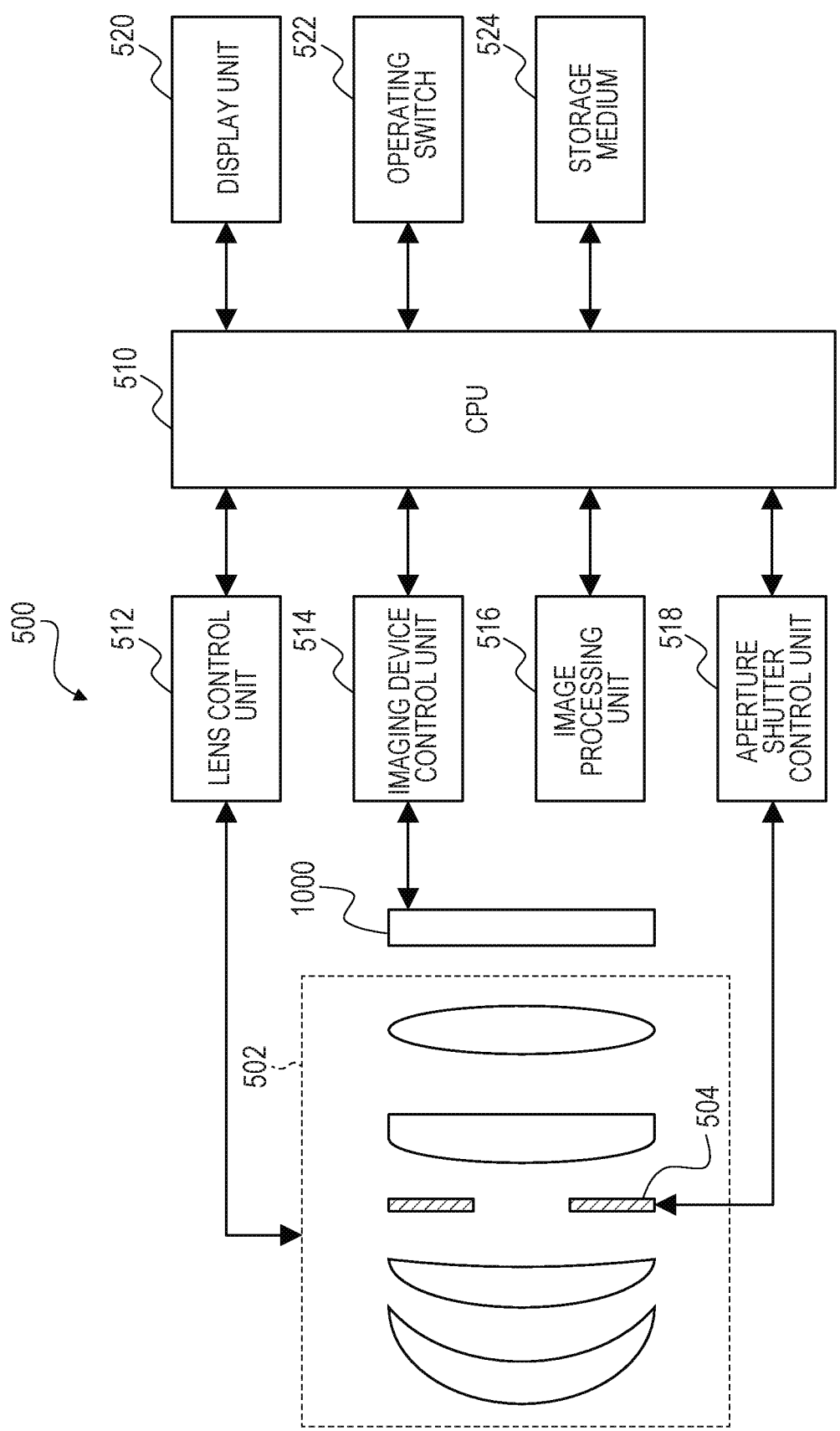

PHOTOELECTRIC CONVERSION DEVICE AND IMAGING SYSTEM

BACKGROUND OF THE INVENTION

Field of the Invention

One disclosed aspect of the embodiments relates to a photoelectric conversion device in which a plurality of semiconductor layers are stacked and an imaging system.

Description of the Related Art

In a photoelectric conversion device, it is possible to reduce the size of the photoelectric conversion device and increase the performance while suppressing increase in size by stacking a plurality of semiconductor layers. Japanese Patent Application Laid-Open No. 2012-33894 discloses a photoelectric conversion device in which a first chip having a first semiconductor layer and a second chip having a second semiconductor layer are stacked. Further, Japanese Patent Application Laid-Open No. 2012-33894 discloses that a first connection part disposed in the first wiring structure of the first chip and a second connection part disposed in the second wiring structure of the second chip are contacted at a junction interface to electrically connect the first chip and the second chip to each other. The first connection part and the second connection part are disposed in a photoelectric conversion region. Application Laid-Open No. 2012-33894 also discloses that a third connection part disposed in the first wiring structure and a fourth connection part disposed in the second wiring structure are contacted at the junction interface to electrically connect the first chip and the second chip to each other. The third connection part and the fourth connection part are disposed in a peripheral region. An area of the first connection part or the second connection part is smaller than an area of the third connection part or the fourth connection part in a planar view.

In the art disclosed in Japanese Patent Application Laid-Open No. 2012-33894, there is no sufficient consideration for connection between the semiconductor layers, and there is room for improvement of characteristics and reliability of the photoelectric conversion device.

SUMMARY OF THE INVENTION

The disclosure provides a photoelectric conversion device with further improved characteristics or reliability in a photoelectric conversion device in which a plurality of semiconductor layers are stacked. A first aspect of a photoelectric conversion device includes a first semiconductor layer, a second semiconductor layer, a first wiring structure, and a second wiring structure. A plurality of photoelectric conversion units are disposed in the first semiconductor layer. A signal processing circuit that processes a signal output from the plurality of photoelectric conversion units is disposed in second semiconductor layer. The first wiring structure is disposed between the first semiconductor layer and the second semiconductor layer. The second wiring structure is disposed between the first wiring structure and the second semiconductor layer. In an photoelectric conversion region in which the plurality of photoelectric conversion units are disposed, a first connection part included in the first wiring structure and a second connection part included in the second wiring structure are in contact with each other at a junction interface of the first wiring structure and the second wiring structure. In a peripheral region around the photoelectric conversion region, a third connection part included in the first wiring structure and a fourth connection part included in the second wiring structure are in contact with each other at the junction interface. The third connection part and the fourth connection part are electrically connected to a power source line or a drive line of a transistor disposed in the photoelectric conversion region of the first semiconductor layer. The area of at least one of the first connection part and the second connection part is different from the area of at least one of the third connection part and the fourth connection part in a planar view.

Further, a second aspect of a photoelectric conversion device includes a first semiconductor layer, a second semiconductor layer, a first wiring structure, and a second wiring structure. A plurality of photoelectric conversion units are disposed in the first semiconductor layer. A signal processing circuit that processes a signal output from the plurality of photoelectric conversion units is disposed in the first semiconductor layer. The first wiring structure is disposed between the first semiconductor layer and the second semiconductor layer. The second wiring structure disposed between the first wiring structure and the second semiconductor layer. In an photoelectric conversion region in which the plurality of photoelectric conversion units are disposed, a first connection part included in the first wiring structure and a second connection part included in the second wiring structure are in contact with each other at a junction interface of the first wiring structure and the second wiring structure. A fifth connection part included in the first wiring structure and a sixth connection part included in the second wiring structure are in contact with each other at the junction interface. The area of at least one of the first connection part and the second connection part is smaller than an area of at least one of the fifth connection part and the sixth connection part.

Further features of the disclosure will become apparent from the following description of exemplary embodiments with reference to the attached drawings.

BRIEF DESCRIPTION OF THE DRAWINGS

FIG. 23 is a configuration diagram of an imaging system according to a third embodiment.

DESCRIPTION OF THE EMBODIMENTS

Figure 1A:
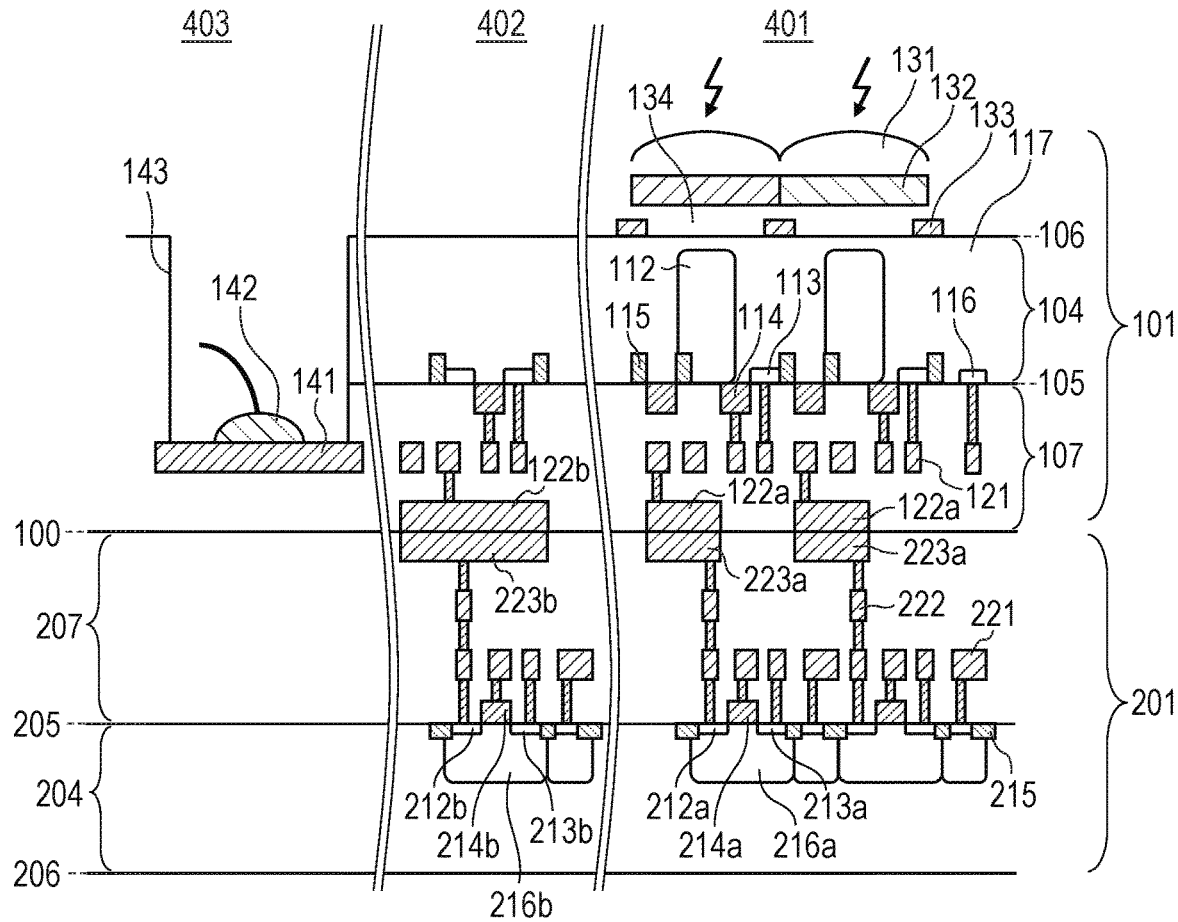
FIG. 1A is a sectional view of a photoelectric conversion device according to a first embodiment.

First Embodiment: Photoelectric Conversion Device with Two-Layer Configuration 1-1: Area of Connection Part of Photoelectric Conversion Region<Area of Connection Part of Peripheral Region FIG. 1A is sectional view of a photoelectric conversion device according to the present embodiment. In the present embodiment, a first chip 101 having a first semiconductor layer 104 and a second chip 201 having a second semiconductor layer 204 are placed against each other. A direction in which the first chip 101 and the second chip 201 are stacked is referred to as a stack direction, and a direction orthogonal to the stack direction is referred to as an in-plane direction. In the following description, the expression of two elements overlapping with each other in a planar view means a relationship in which a projection image of one of the two elements is projected on the other of the two elements, and the projection here means projection in the stack direction.

First Chip

The first chip 101 has an photoelectric conversion region 401 (imaging region), a peripheral region 402 disposed at a position near the chip end of the photoelectric conversion region 401, and a pad region 403 disposed at a position closer to the chip end than the peripheral region 402. That is, the pad region 403, the peripheral region 402, and the photoelectric conversion region 401 are located in this order from the chip end.

The first semiconductor layer 104 is a layer made of a silicon, for example. An element isolation region 115 is disposed in the first semiconductor layer 104, and an active region and an inactive region (field region) are partitioned by the element isolation region 115. A plurality of transistors are disposed in the well 117.

A plurality of pixels are arranged in the first semiconductor layer 104. Each of the pixels has at least one photoelectric conversion unit 112. In FIG. 1A, the photoelectric conversion unit 112, a gate electrode 114, and a floating diffusion (hereinafter, referred to as an FD) 113 are disposed for each of the plurality of pixels. In response to a control signal being disposed to the gate electrode 114, charges accumulated in the photoelectric conversion unit 112 are transferred to the FD 113. Thus, such a transistor may be referred to as a transfer transistor.

The FD 113 may be shared by a plurality of photoelectric conversion units 112. For example, a single FD 113 may be shared by four photoelectric conversion units.

Although not illustrated, a charge drain transistor (overflow transistor) that drains charges accumulated in the photoelectric conversion unit 112 may be disposed in the photoelectric conversion region 401 of the first semiconductor layer 104. Further, similarly, transistors connected to the FD 113, such as a reset transistor, an amplification transistor, a selection transistor, or the like, may be disposed in the photoelectric conversion region 401. Each of these transistors may be a pixel transistor.

The photoelectric conversion region 401 is defined as a region in which a plurality of photoelectric conversion units 112 and a plurality of pixel transistors used for capturing are disposed. Alternatively, the photoelectric conversion region 401 is defined as a region in which a plurality of micro lenses 131 are disposed.

The peripheral region 402 is disposed between the photoelectric conversion region 401 and the end of the first chip 101. As illustrated in FIG. 1A, a transistor can be disposed in the first semiconductor layer 104 in the peripheral region 402. In the peripheral region 402 of the first chip 101, however, no transistor may be disposed.

A first wiring structure 107 is disposed on a front face 105 side of the first semiconductor layer 104. That is, the first wiring structure 107 is disposed between the first semiconductor layer 104 and the second semiconductor layer 204. The first wiring structure 107 has a plurality of insulating layers and a plurality of wiring layers. In the present embodiment, a wiring layer 121 and a wiring layer 122 are disposed as a plurality of wiring layers. Wirings 122a and 122b are disposed in the wiring layer 122. Thus, when a particular wiring is focused on of wirings disposed in a certain wiring layer, alphabet is appended to the reference numeral.

The wiring 122a is a wiring disposed in the photoelectric conversion region 401, the wiring 122b is a wiring disposed in the peripheral region 402. To provide electrical connection between the wiring layer 121 and each transistor, a contact plug is disposed. Further, to provide electrical connection between wiring layers, for example, between the wiring layer 121 and the wiring layer 122, a via plug is disposed. Furthermore, to reduce the electrical resistance between the wiring layer 121 and the well 117, a well contact part 116 made of a semiconductor having the same conductivity type as the conductivity type of the well 117 is disposed in the first semiconductor layer 104.

A pad opening 143 is formed in a part of the first semiconductor layer 104 and the first wiring structure 107, and a pad electrode 141 is arranged in the same layer as the wiring layer 121. The pad electrode 141 is connected to a bonding wire 142. The bonding wire 142 may be a bump. The pad region 403 is defined as a region in which the pad electrode 141 is disposed. Alternatively, the pad region 403 is defined as a region in which the pad electrode 141 is disposed and a region in which a transistor directly connected to the pad electrode 141 is disposed.

A light-shielding member 133, a dielectric film 134, a color filter 132, and a micro lens 131 are disposed on a backside face 106 side of the first semiconductor layer 104. With such a configuration, an external light is incident from the backside face 106 side of the first semiconductor layer 104, and a so-called backside illuminated photoelectric conversion device is disposed.

Second Chip

The second chip 201 also has the photoelectric conversion region 401, the peripheral region 402, and the pad region 403 in the same manner as the first chip 101. The second chip 201 has a signal processing circuit that processes a signal output from the photoelectric conversion unit 112. A signal processing circuit may be, for example, an analog-to-digital converter unit (AD converter unit). Further, a comparator that is a part of the AD converter unit also corresponds to the signal processing circuit, for example.

In the second chip 201, the photoelectric conversion region 401 refers to a region that overlaps with a plurality of photoelectric conversion units disposed in the first chip 101 in a planar view. Alternatively, the photoelectric conversion region 401 refers to a region that overlaps with the micro lens 131 disposed in the first chip 101 in a planar view.

Further, in the second chip 201, the pad region 403 is a region that overlaps with the pad electrode 141 disposed in the first chip 101. Further, when a pad electrode is disposed in the second chip 201, the pad region 403 refers to a region in which the pad electrode arranged in the second chip 201 is disposed. Alternatively, the pad region 403 refers to a region that overlaps with a region in which a transistor directly connected to a pad electrode is disposed or the transistor is disposed.

Furthermore, in the second chip 201, the peripheral region 402 is a region between the photoelectric conversion region 401 and the pad region 403.

The second semiconductor layer 204 is a silicon, for example, and has a front face 205 and a backside face 206. An element isolation region 215 is disposed on the front face 205 side of the second semiconductor layer 204, and an active region and an inactive region are partitioned in the same manner as the first chip 101. A plurality of transistors are disposed in the second semiconductor layer 204. As components of a transistor disposed in the photoelectric conversion region 401, source/drain regions 212a and 213a, a gate electrode 214a, and a well region 216a are depicted. Further, as components of a transistor disposed in the peripheral region 402, source/drain regions 212b and 213b, a gate electrode 214b, and a well region 216b are depicted.

A second wiring structure 207 is disposed on the front face 205 side of the second semiconductor layer 204. That is, the second wiring structure 207 is disposed between the first wiring structure 107 and the second semiconductor layer 204. The second wiring structure 207 is formed of a plurality of insulating layers and a plurality of wiring layers. In the present embodiment, as a plurality of wiring layers, a wiring layer 221, a wiring layer 222, and a wiring layer 223 are disposed.

In this example, a wiring 223a is a wiring disposed in the photoelectric conversion region 401, and a wiring 223b is a wiring disposed in the peripheral region 402. To provide electrical connection between wiring layer 221 and each transistor, a contact plug is disposed. To provide electrical connection between wiring layers, for example, between the wiring layer 221 and the wiring layer 222, a via plug is disposed.

Connection Between First Chip and Second Chip

The wirings 122a and 122b are arranged in the uppermost wiring layer 122 in the first wiring structure 107 of the first chip 101. Further, the wirings 223a and 223b are arranged in the uppermost wiring layer 223 in the second wiring structure 207 of the second chip 201. At a junction interface 100, the wiring 122a (first connection part) in the first wiring structure 107 is in contact with the wiring 223a (second connection part) of the second wiring structure 207. Further, at a junction interface 100, the wiring 122b (third connection part) in the first wiring structure 107 is in contact with the wiring 223b (fourth connection part) of the second wiring structure 207.

Figure 1B:
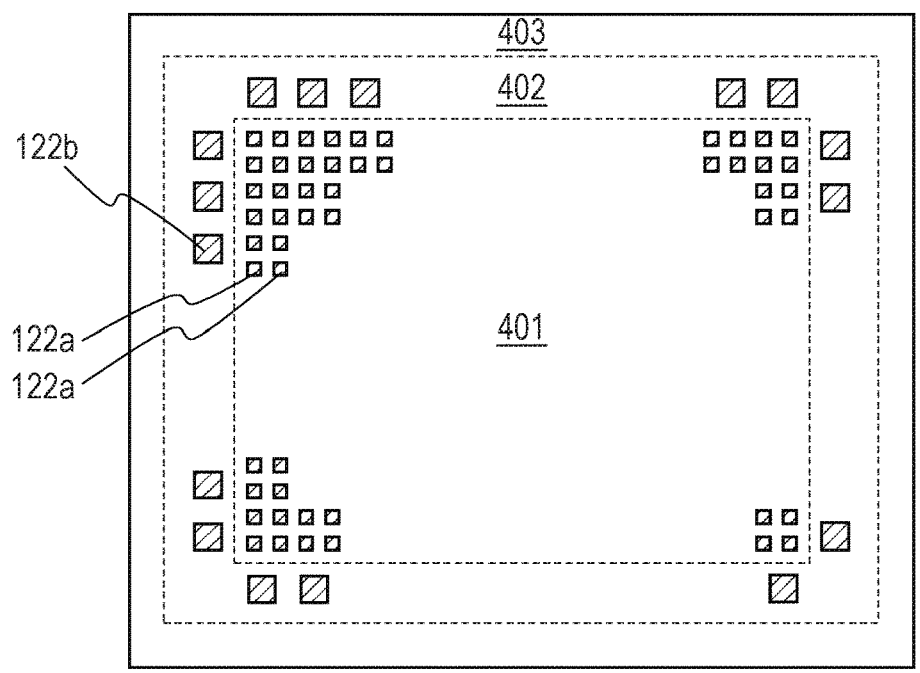
FIG. 1B is a plan view of a photoelectric conversion device according to the first embodiment.

FIG. 1B is a plan view when, the first chip 101 is observed from the second chip 201 at the junction interface 100 in FIG. 1A, which illustrates the wiring 122a and the wiring 122b of the first wiring structure 107. In such a way, in a planar view, the area of the wiring 122a (first connection part) is smaller than the area of the wiring 122b (third connection part). Note that, in the present specification, the planar view is a plan view obtained by projecting respective components of the photoelectric conversion device on a plane parallel to the surface of the first semiconductor layer 104 or the second semiconductor layer 204, for example. Further, although not illustrated, when the second chip 201 is observed from the first chip 101, the area of the wiring 223a (second connection part) of the second wiring structure 207 is smaller than the area of the wiring 223b (fourth connection part).

Note that, while the example in which the area of the first connection part and the area of the second connection part are the same and the area of the third connection part and the area of the fourth connection part are the same is illustrated in FIG. 1A, the area may not necessarily be required to be the same in these pairs.

The transistor disposed in the peripheral region 402 of the second chip 201 is a transistor that transmits a pulse signal used for driving the pixel transistor disposed in the photoelectric conversion region 401 of the first chip 101, for example. For example, the pixel transistor disposed in the photoelectric conversion region 401 may be, for example, a transfer transistor, a reset transistor, an overflow transistor, a selection transistor, or the like. For example, a drive pulse signal transmitted to the wiring 223b and the wiring 122b is transmitted to a control line extending in the row direction of the photoelectric conversion region of the first chip 101 and arranged on a pixel row basis. The drive pulse signal transmitted to the control line is input to the gate of the pixel transistor disposed in the photoelectric conversion region 401.

Further, the wiring 223b and the wiring 122b may be electrically connected to a power source line of a transistor disposed in the photoelectric conversion region 401 of the first chip 101. For example, a contact plug electrically connected to the well 117 and the wiring 223b and the wiring 122b are electrically connected via the well contact part 116. Further, a power source line supplied with a voltage and the wiring 223b and the wiring 122b are electrically connected via the reset transistor or the overflow transistor, for example.

Advantage (1) Obtained by Area of Connection Part of Photoelectric Conversion Region<Area of Connection Part of Peripheral Region The present embodiment is configured such that the area of the connection part disposed in the photoelectric conversion region is smaller than the area of the connection part disposed in the peripheral region. Advantages obtained by employing such a configuration will be described below.

Figure 2A:
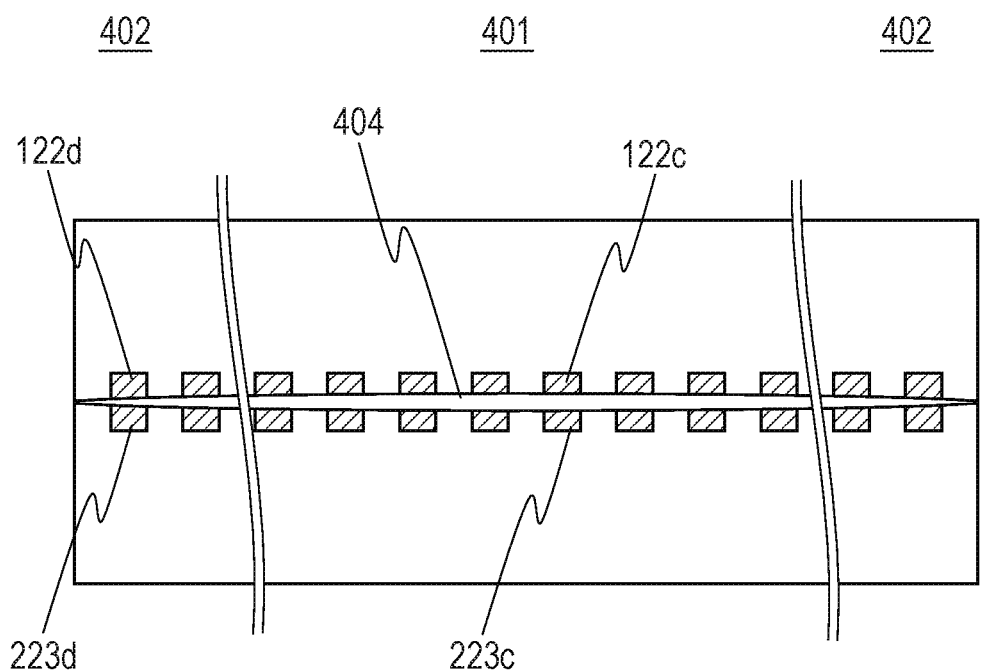
FIG. 2A and FIG. 2B are explanatory diagrams for describing an advantage of the first embodiment.

FIG. 2A is a diagram illustrating a comparative example. When the first wiring structure 107 of the first chip 101 and the second wiring structure 207 of the second chip 201 are joined, it is necessary to planarize the surface of the first wiring structure 107 and the surface of the second wiring structure 207 in advance. Accordingly, Chemical Mechanical Polishing (CMP) is used. It is assumed here that, as illustrated in FIG. 2A, wirings 122c, 122d, 223c, and 223d having the same area in a planar view are disposed in the photoelectric conversion region 401 and the peripheral region 402. In this case, in the CMP process, the grinding amount is greater in the center portion than in the peripheral portion, which may cause a so-called dishing 404.

Figure 2B:
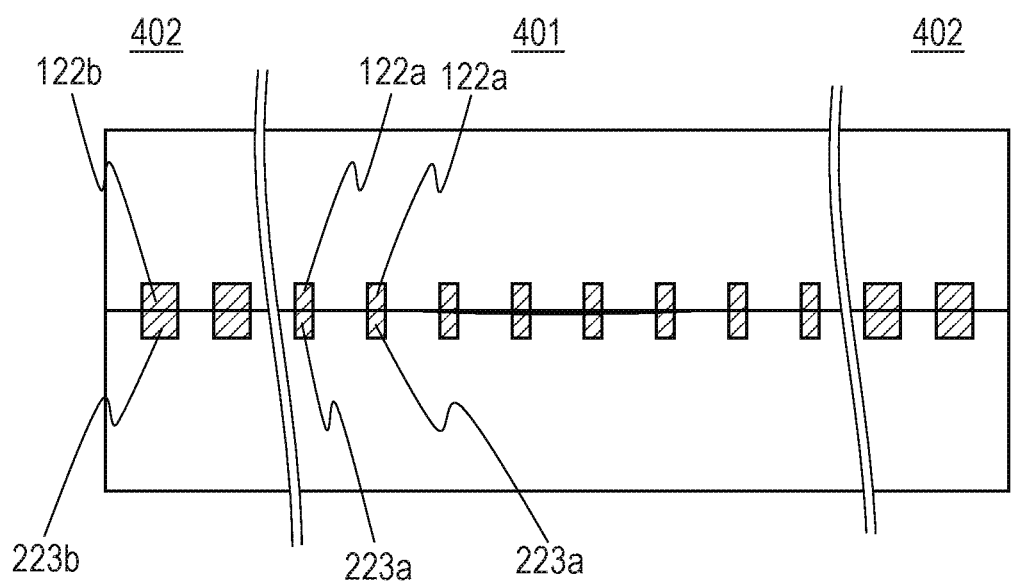

On the other hand, FIG. 2B illustrates a configuration in which each of the areas of the wirings 122a and 223a disposed in the photoelectric conversion region is smaller than that of the wirings 122b and 223b. Since an insulating film is less likely to be shaved than a material forming a wiring, when the area of the wiring is reduced, the grinding amount of the center portion is reduced. Such a configuration provides an advantage of being able to suppress occurrence of the dishing 404 in a CMP process. As a result, it is possible to reduce a contact failure between wirings (between connection parts) in the photoelectric conversion region 401. Thereby, in a photoelectric conversion device in which a plurality of semiconductor layers are stacked, a photoelectric conversion device with further improved characteristics can be disposed.

Advantage (2) Obtained by Area of Connection Part of Photoelectric Conversion Region<Area of Connection Part of Peripheral Region As described above, the wiring 223b and the wiring 122b may be electrically connected to a power source line of a transistor disposed in the photoelectric conversion region 401 of the first chip 101. For example, in a case of direct connection to the pad electrode 141, since drive power is large, the resistance of a wiring does not cause a significant problem. However, there is no direct contact with the pad electrode 141, and drive power is relatively smaller when connected to the power source line of the photoelectric conversion region of the first chip 101 via the transistor. In such a case, it is preferable that the electrical resistance of the wiring 223b and the wiring 122b connected the power source line be reduced as much as possible. This is because, when the electrical resistance of a wiring is high, it takes time for the voltage of the power source line to reach a predetermined value, which may affect image quality. Accordingly, in the present embodiment, each of the areas of the wirings 122b and 223b is larger than each of the areas of the wirings 122a and 223a in a planar view. Thereby, in a photoelectric conversion device in which a plurality of semiconductor layers are stacked, a photoelectric conversion device with further improved characteristics can be disposed.

Advantage (3) Obtained by Area of Connection Part of Photoelectric Conversion Region<Area of Connection Part of Peripheral Region As described above, a transistor disposed in the peripheral region 402 of the second chip 201 is a transistor that transfers a pulse signal used for driving the pixel transistor disposed in the photoelectric conversion region 401 of the first chip 101, for example. The pixel transistor may be, for example, the transfer transistor, the reset transistor, the overflow transistor, the selection transistor, or the like. The pulse signal transmitted from the second chip 201 to the first chip 101 is divided, via the wiring 223b and the wiring 122b, into a plurality of drive lines disposed in association with pixel rows disposed in the photoelectric conversion region. The wirings for these drive lines are disposed in the first wiring structure 107. Thus, when a contact failure occurs in the wiring 223b and the wiring 122b at a certain part, this affects pixels on at least one row. When each of the areas of the wiring 122b and the wiring 223b is larger than the area of the wiring 122a or the wiring 223a, this can reduce a contact failure. As a result, a photoelectric conversion device with improved reliability can be disposed.

Note that FIG. 1B illustrates an example in which only the wiring having the smaller area (the wiring 122a) is arranged in the photoelectric conversion region 401 and only the wiring having the larger area (the wiring 122b) is arranged in the peripheral region 402. However, a wiring having a larger area than the wiring 122a may be mixed and arranged in the photoelectric conversion region 401. Further, a wiring having a smaller area than the wiring 122b may be mixed and arranged in the peripheral region 402. The same applies to embodiments described below.

Figure 3A:
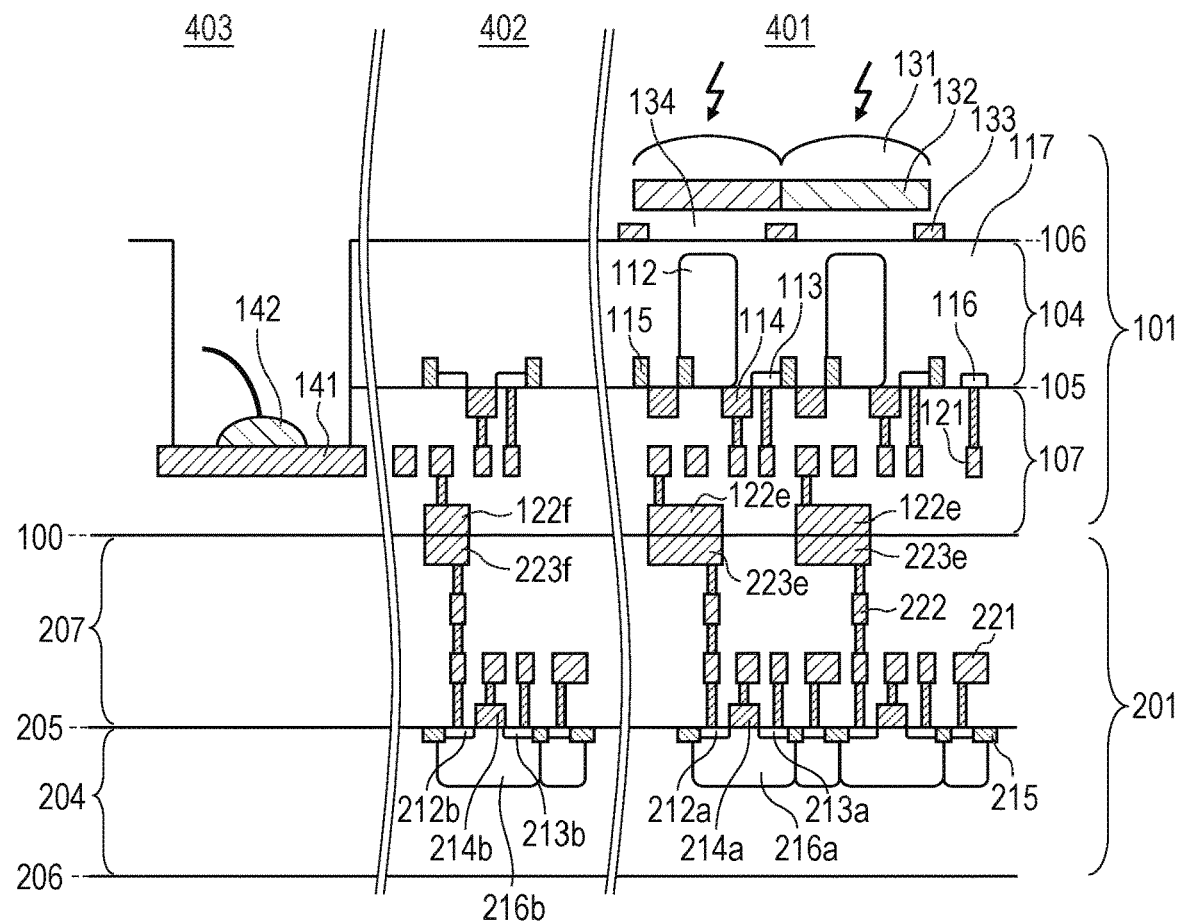
FIG. 3A is a sectional view of a photoelectric conversion device according to the first embodiment.
Figure 3B:
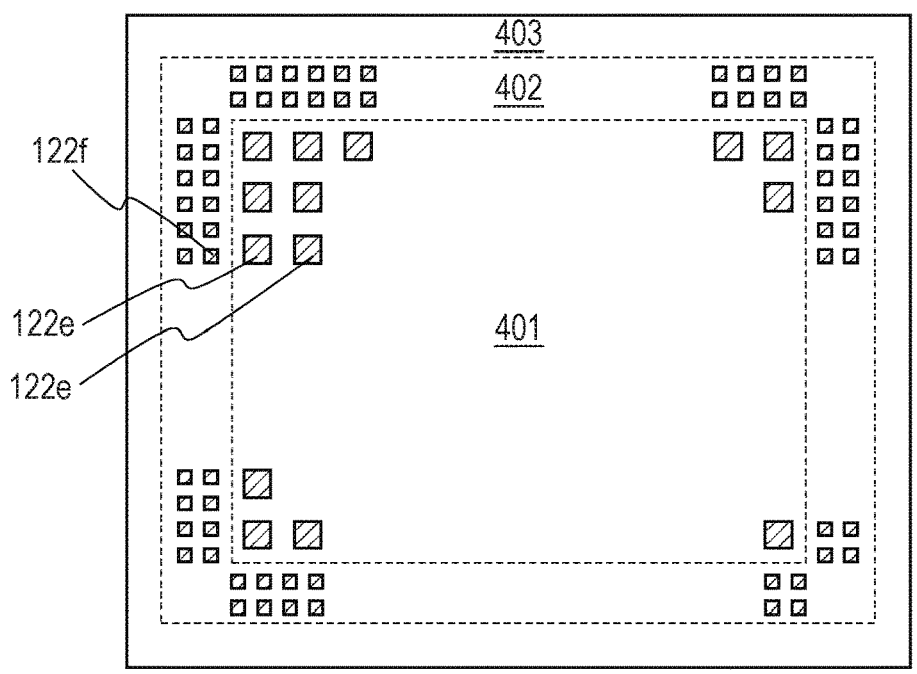
FIG. 3B is a plan view of a photoelectric conversion device according to the first embodiment.

1-2: Area of Connection Part of Photoelectric Conversion Region>Area of Connection Part of Peripheral Region FIG. 3A and FIG. 3B are a sectional view and a plan view of the photoelectric conversion device according to the present embodiment. The elements labeled with the same reference are elements having the same function. A difference from FIG. 1A and FIG. 1B is that each of the areas of wirings 122e (first connection part) and wirings 223e (second connection part) is larger than each of the areas of a wiring 122f (third connection part) and a wiring 223f (fourth connection part) in a planar view. That is, the relationship of the areas of the connection parts is opposite to that illustrated in FIG. 1A and FIG. 1B.

FIG. 3A is a sectional view of a photoelectric conversion device according to the present embodiment, which satisfies the above conditions. Further, FIG. 3B is a planar view of the junction interface 100 of FIG. 3A when the first chip 101 side is observed from the second chip 201 side. The area of the wiring 122f (third connection part) is smaller than the area of the wiring 122e (first connection part) of the first wiring structure 107. Further, although not illustrated, when the second chip 201 is observed from the first chip 101, the area of the wiring 223f (fourth connection part) is smaller than the area of the wiring 223e (second connection part).

Advantage (1) Obtained by Area of Connection Part of Photoelectric Conversion Region>Area of Connection Part of Peripheral Region A transistor disposed in the peripheral region 402 of the second chip 201 is a transistor that transfers a pulse signal used for driving the pixel transistor disposed in the photoelectric conversion region 401 of the first chip 101, for example. The pixel transistor may be, for example, the transfer transistor, the reset transistor, the overflow transistor, the selection transistor, or the like. Thus, an increase in the wiring 223f and the wiring 122f also results in an increased wiring capacitance (parasitic capacitance) due to capacitive coupling with wirings arranged vertically or horizontally around these wirings. This results in an increased wiring capacitance of a drive line input to the gate of the pixel transistor, which may cause propagation delay of each drive pulse and may cause deterioration of image quality. Accordingly, in the present embodiment, each of the areas of the wirings 223f (third connection part) and 122f (fourth connection part) disposed in the peripheral region 402 is smaller than each of the areas of the wirings 122e (first connection part) disposed in the photoelectric conversion region and 223e (third connection part). Thereby, in a photoelectric conversion device in which a plurality of semiconductor layers are stacked, a photoelectric conversion device with improved characteristics can be disposed.

Advantage (2) Obtained by Area of Connection Part of Photoelectric Conversion Region>Area of Connection Part of Peripheral Region Further, by reducing the areas of the wirings 223f and 122f, it is possible to ensure flexibility of a wiring layout other than the wirings 223f and 122f. For example, a plurality of drive lines used for driving respective transistors of pixels are required to be arranged in the first chip 101 in accordance with the pitch of pixels. When the plurality of wirings 223f and 122f are electrically connected to a plurality of drive lines disposed in the first chip 101, a relatively smaller pitch of pixels requires a relatively smaller pitch between the wirings 223f and 122f. Accordingly, by reducing the areas of the wirings 223f and 122f, the interval between pixels and the interval between the wirings 223f or the wirings 122f can be the same. If the areas of the wirings 223f and 122f were not reduced, the wirings 223f and 122f would be required to be arranged in a zigzag manner on a row basis. With such a zigzag arrangement, the distance between the wirings 223f and 122f to a transfer transistor, for example, would be different on a row basis, and the degree of propagation delay of a signal may be different on a row basis, which may cause unevenness in an image. According to the configuration described above, in a photoelectric conversion device in which a plurality of semiconductor layers are stacked, a photoelectric conversion device with improved characteristics can be disposed.

Advantage (3) Obtained by Area of Connection Part of Photoelectric Conversion Region>Area of Connection Part of Peripheral Region Furthermore, in a case of a photoelectric conversion device in which the area occupied by the peripheral region 402 with respect to the photoelectric conversion region 401 is relatively large, the dishing 404 described using FIG. 2A may occur in the peripheral region 402. In this case, with reduction in the areas of the wirings 223f and 122f, the dishing 404 can also be suppressed. As a result, it is possible to reduce a contact failure or the like between wirings (between connection parts) in the peripheral region 402. Thereby, in a photoelectric conversion device in which a plurality of semiconductor layers are stacked, a photoelectric conversion device with improved reliability can be disposed.

MODIFIED EXAMPLE

FIG. 3B illustrates an example in which only the wiring having the larger area (the wiring 122e) is arranged in the photoelectric conversion region 401 and only the wiring having the smaller area (the wiring 1220 is arranged in the peripheral region 402. However, a wiring having a smaller area than the wiring 122e may be mixed and arranged in the photoelectric conversion region 401. Further, a wiring having a larger area than the wiring 122f may be mixed and arranged in the peripheral region 402.

Figure 4A:
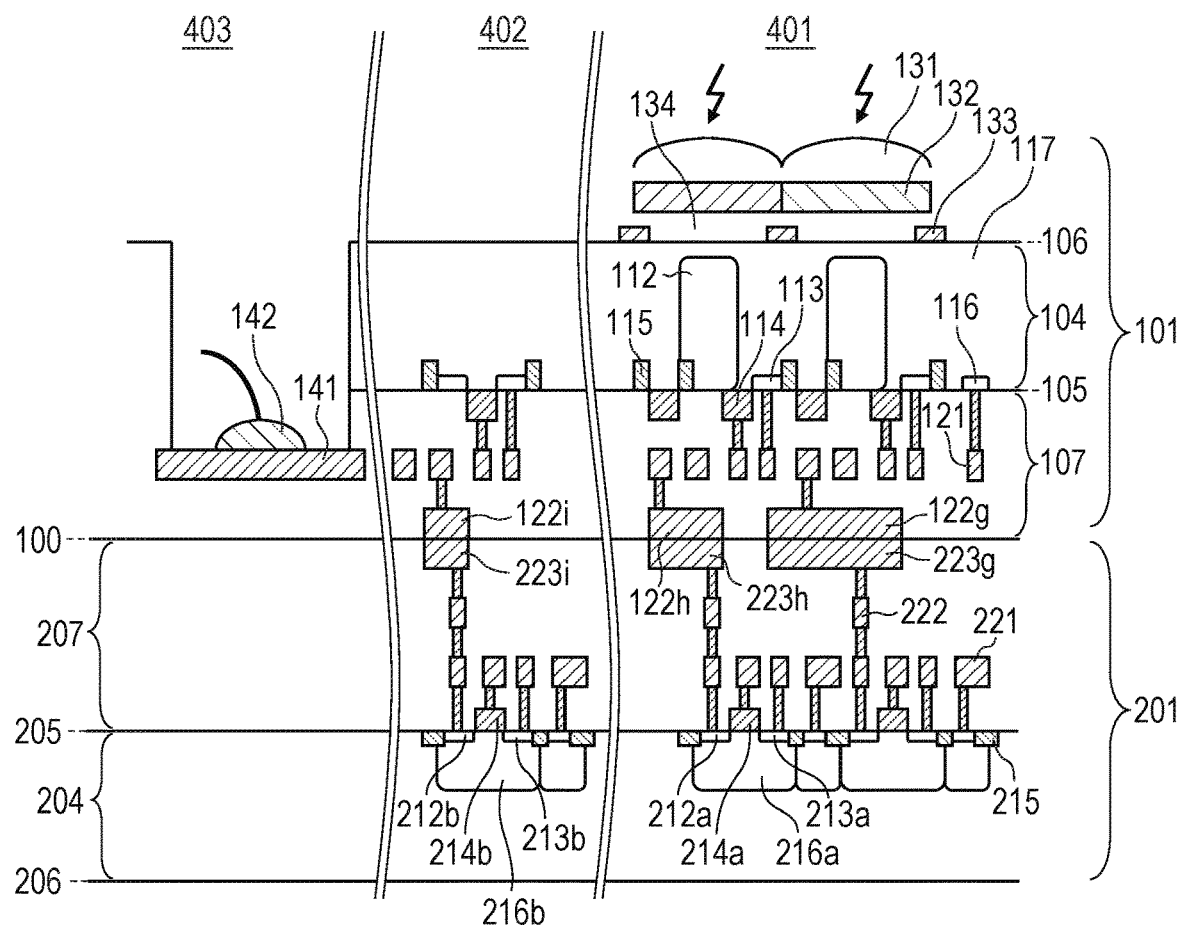
FIG. 4A is a sectional view of a photoelectric conversion device according to the first embodiment.
Figure 4B:
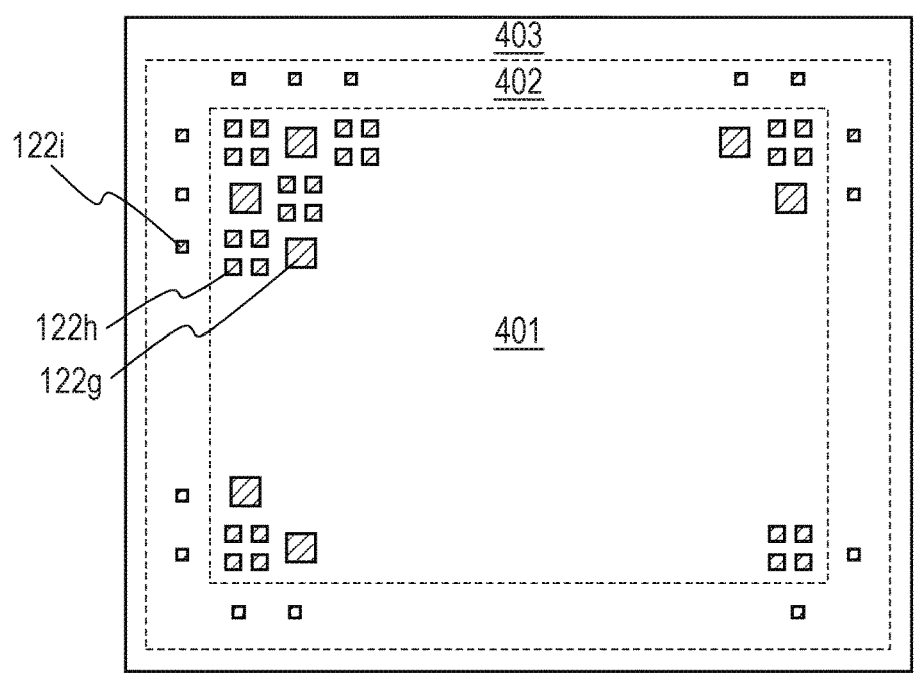
FIG. 4B is a plan view of a photoelectric conversion device according to the first embodiment.

1-3: Connection Parts with Different Areas Mixed in Photoelectric Conversion Region FIG. 4A and FIG. 4B are a sectional view and a plan view of the photoelectric conversion device according to the present embodiment. The elements labeled with the same reference are elements having the same function. A difference from FIG. 1A and FIG. 1B and FIG. 3A and FIG. 3B is that a plurality of wirings having different areas are arranged in the photoelectric conversion region 401 in a planar view.

FIG. 4A is a sectional view of the photoelectric conversion device according to the present embodiment. FIG. 4B is a planar view of the junction interface 100 of FIG. 4A when the first chip 101 side is observed from the second chip 201 side. The area of the wiring 122h (first connection part) is smaller than the area of the wiring 122g (fifth connection part) in the photoelectric conversion region 401. Further, the area of the wiring 223h (second connection part) is smaller than the area of the wiring 223g (sixth connection part).

Advantage (1) Obtained by Mixture of Connection Parts with Different Areas in Photoelectric Conversion Region As described above, a plurality of pixel transistors are arranged in the photoelectric conversion region 401 of the first chip 101. It is preferable that the wirings used for input or output to and from each pixel transistor be changed as appropriate in accordance with characteristics required for each pixel transistor.

For example, the FD 113 preferably has a smaller capacitance to reduce noise. Further, a wiring used for driving that is connected to the gate electrode of each pixel transistor preferably has a smaller wiring capacitance in order to suppress delay of a drive signal. Further, when a connection part of the first chip and the second chip is disposed between transistors forming a comparator, the wiring capacitance is preferably smaller so as not to provide excessive load on the pixel output.

On the other hand, the connection part for the power source line of the pixel transistor preferably has a smaller electric resistance so that, even when voltage fluctuation occurs externally, a predetermined voltage can be recovered in short time. Further, in some wirings, a larger capacitance may improve the image quality.

Accordingly, a wiring on which the capacitance is to be smaller is connected by the wiring 122h and the wiring 223h, and a wiring on which the electrical resistance is to be reduced or the capacitance is to be increased is connected by the wiring 122g and the wiring 223g. Thereby, in a photoelectric conversion device in which a plurality of semiconductor layers are stacked, a photoelectric conversion device with improved reliability can be disposed.

Further, in FIG. 4A, the areas of a wiring 122i and a wiring 223i arranged in the peripheral region 402 are smaller than the areas of the wiring 122h and the wiring 223h arranged in the photoelectric conversion region 401. Thereby, as illustrated in the description associated with FIG. 3A, the capacitances of the wiring 122i and the wiring 223i disposed in the peripheral region 402 can be reduced, and in a photoelectric conversion device in which a plurality of semiconductor layers are stacked, a photoelectric conversion device with improved reliability can be disposed.

Note that FIG. 4A illustrates an example in which only the wiring having the smaller area (the wiring 122i) than the wirings 122g and 122h of the photoelectric conversion region 401 is arranged in the peripheral region 402. However, a wiring having a larger area than the wiring 122h may be mixed and arranged in the peripheral region 402. Further, a wiring having a larger area than the wiring 122g may be mixed and arranged in the peripheral region 402.

Variations of Mixed Arrangement

FIG. 5A to FIG. 7D illustrate examples of variations when the wirings 122g and 122h having different areas in the photoelectric conversion region 401 are arranged.

In FIG. 5A to FIG. 5D, "P" denotes a region corresponding to a single pixel. For example, a region corresponding to a single pixel is a region corresponding to a single photoelectric conversion unit 112. Alternatively, a region corresponding to a single pixel is a region corresponding to a single micro lens 131.

Figure 5A:
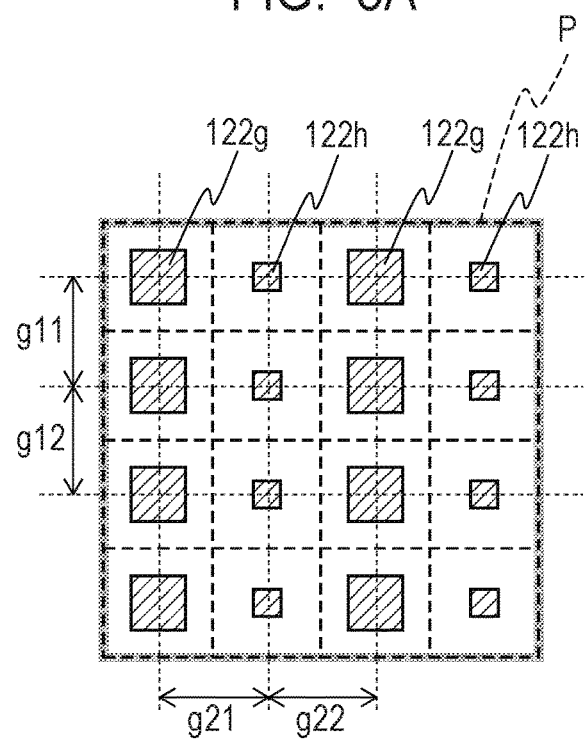
FIGS. 5A, 5B, 5C and 5D are diagrams illustrating a modified example of a connection part of the photoelectric conversion device according to the first embodiment.

FIG. 5A illustrates an example in which one wiring corresponds to one pixel. The centroid pitches between wirings are the same between adjacent pixels. Specifically, pitches g11, g12, g21, and g22 are the same. Since there is heat generation in each wiring due to a current flowing in each wiring, each wiring can be considered as a heat generating member. With centroid pitches between wirings being the same, the heat generating members are also positioned at the same interval, and thus unevenness of heat generation can be suppressed on the junction interface 100.

Figure 5B:
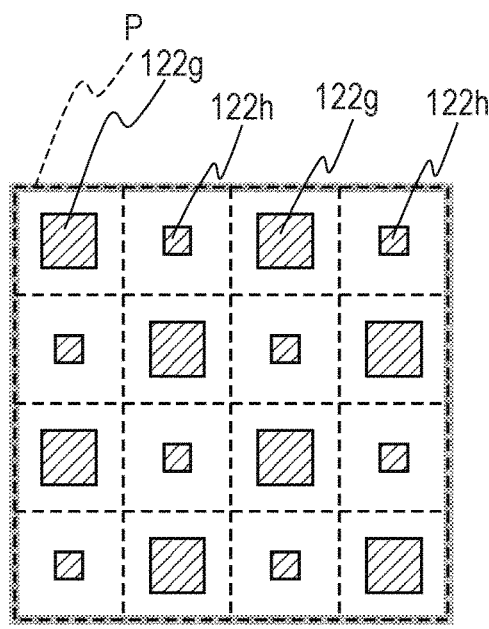

FIG. 5B illustrates a modified example of FIG. 5A. In FIG. 5A, only the wirings having the same area are arranged on the same column, and the wirings having different areas are arranged between adjacent columns. In FIG. 5B, however, wirings whose areas are different vertically and horizontally are arranged. Note that FIG. 5A and FIG. 5B are the same in that the centroid pitches between wirings are the same between adjacent pixels. According to such a configuration, the planar evenness within the photoelectric conversion region 401 can be further improved over the example of FIG. 5A.

Figure 5C:
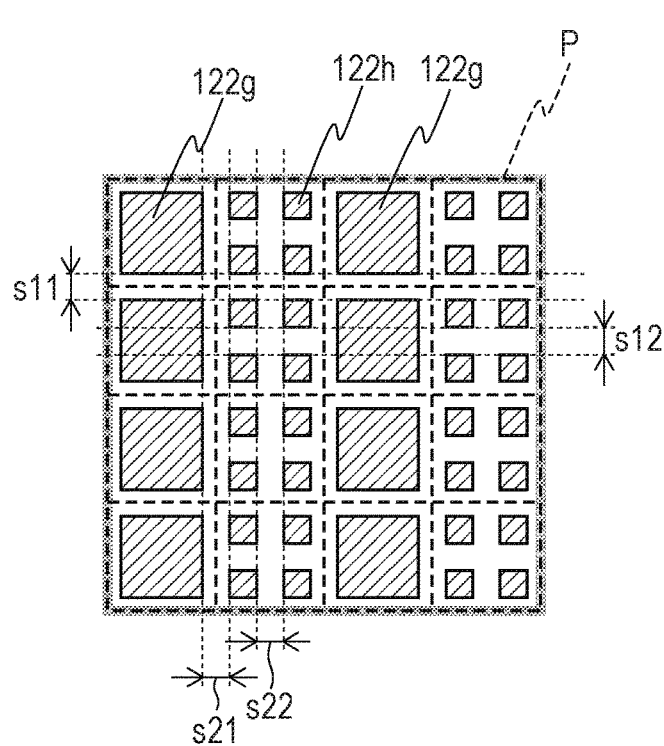

In FIG. 5C, one wiring 122g having a large area is arranged and four wiring 122h having a small area are arranged for one pixel. Further, all the spacing between the wirings 122g, the spacing between the wirings 122h, and the spacing between the wiring 122g and the wiring 122h are the same. Specifically, spacings s11, s12, s21, and s22 are the same. According to such a configuration, since the spacings between wirings are the same, the parasitic capacitances occurring between the wirings can be substantially the same. For example, such a configuration is useful when it is desirable to have the same parasitic capacitances to obtain the same pulse waveforms for wirings used for driving respective pixel transistors or the like.

Figure 5D:
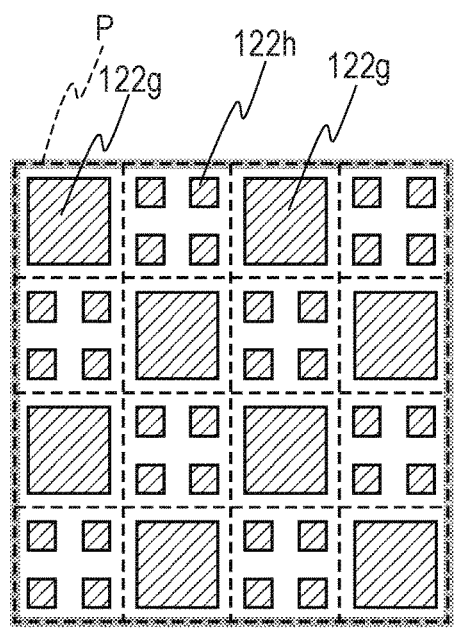

FIG. 5D illustrates a modified example of FIG. 5C. In FIG. 5C, when a region corresponding to one pixel is focused on, the number of wirings having the same area is the same on a single column, wiring having different areas are aligned between adjacent columns. On the other hand, in FIG. 5D, wirings whose areas are different vertically and horizontally are arranged. Note that FIG. 5C and FIG. 5D are the same in that adjacent wirings are arranged in the same spacing. According to such a configuration, the planar evenness within the photoelectric conversion region 401 can be further improved over FIG. 5C.

Figure 6A:
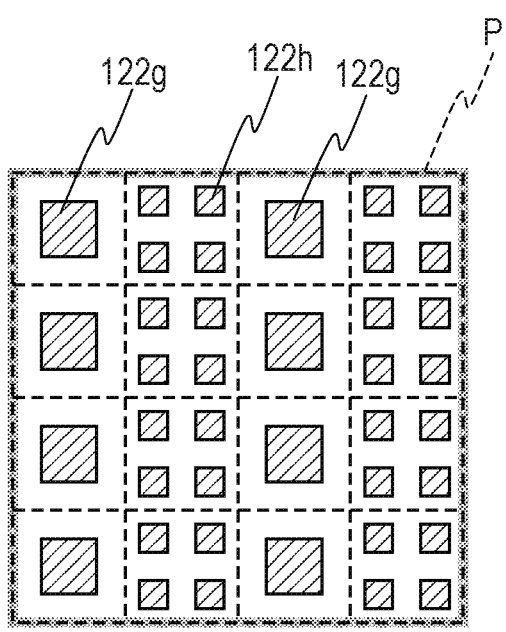
FIG. 6A and FIG. 6B are diagrams illustrating a modified example of a connection part of the photoelectric conversion device according to the first embodiment.

FIG. 6A illustrates an example in which the density of wirings occupied in one pixel is constant. For example, the area of the wiring 122g is four times larger than the area of the wiring 122h. Further, one wiring 122g is disposed in a region corresponding to one pixel, and four wirings 122h are disposed. That is, (wiring density)=(the total area of all the wirings in a region corresponding to one pixel)/(the area of a region corresponding to one pixel) is constant. According to such a configuration, in the CMP process described by using FIG. 2A and FIG. 2B, since the wiring density is constant, influence of a local dishing may be reduced.

Figure 6B:
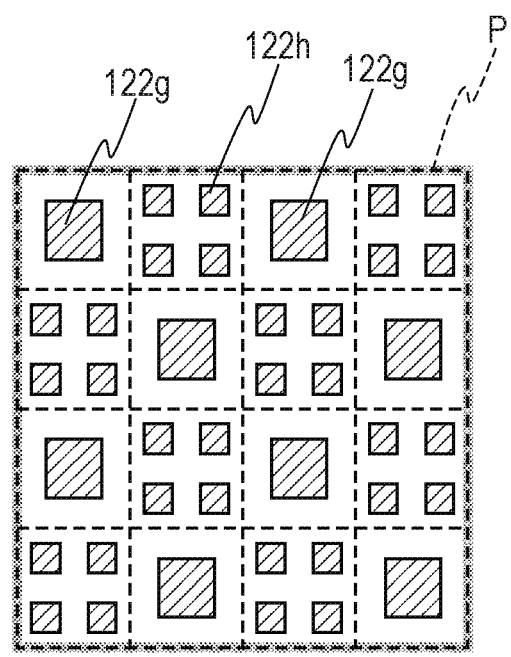

FIG. 6B illustrates a modified example of FIG. 6A. In FIG. 6A, wirings having the same area are arranged on a single column, and wirings having different areas are arranged between adjacent columns. On the other hand, in FIG. 6B, the areas of wirings are different vertically and horizontally. Note that FIG. 6A and FIG. 6B are the same in that respective adjacent regions have the same wiring density.

Figure 7A:
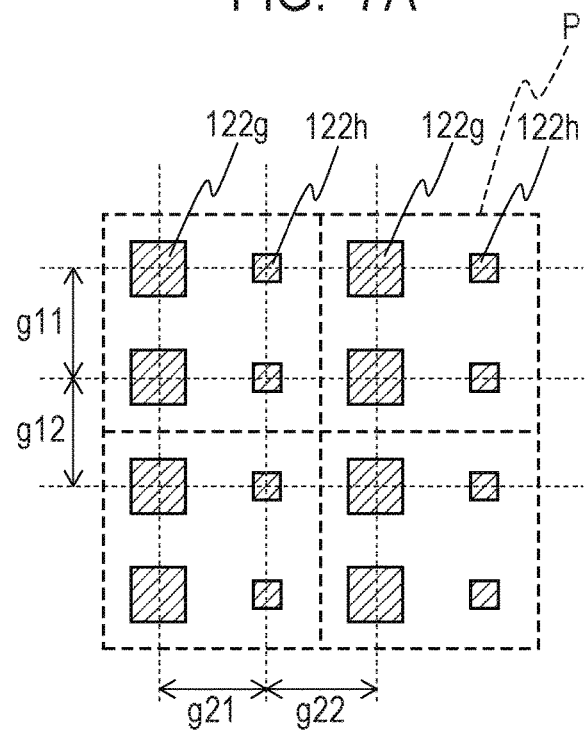
FIGS. 7A, 7B, 7C and 7D are diagrams illustrating a modified example of a connection part of the photoelectric conversion device according to the first embodiment.

FIG. 7A illustrates a modified example of FIG. 5A. In FIG. 5A, one wiring is disposed in a region corresponding to one pixel. On the other hand, FIG. 7A illustrates an example in which a plurality of wirings having different areas are arranged in a region corresponding to one pixel. Specifically, two wirings 122g and two wirings 122h are arranged in a region corresponding to one pixel. Here, the centroid pitch between wirings arranged in a region corresponding to the first pixel is the same as the centroid pitch between a wiring arranged in the region corresponding to the first pixel and a wiring arranged in a region corresponding to the second pixel. Specifically, pitches g11, g12, g21, and g22 are the same. Since there is heat generation in each wiring due to a current flowing in each wiring, each wiring can be considered as a heat generating member. With centroid pitches between wirings being the same, the heat generating members are also positioned at the same interval, and thus unevenness of heat generation can be suppressed on the junction interface 100.

Figure 7B:
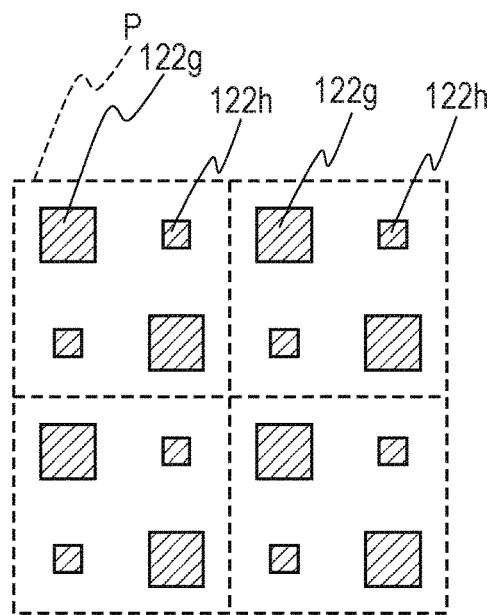
Figure 7C:
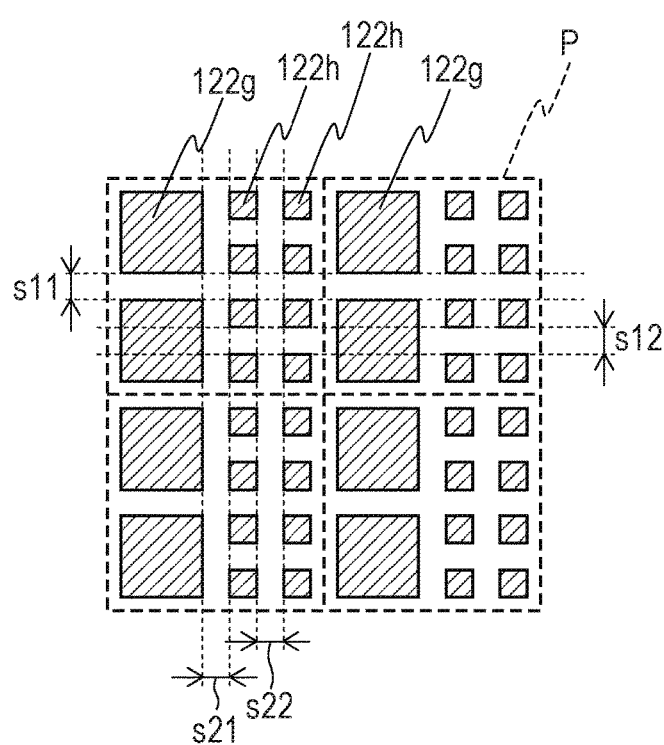
Figure 7D:
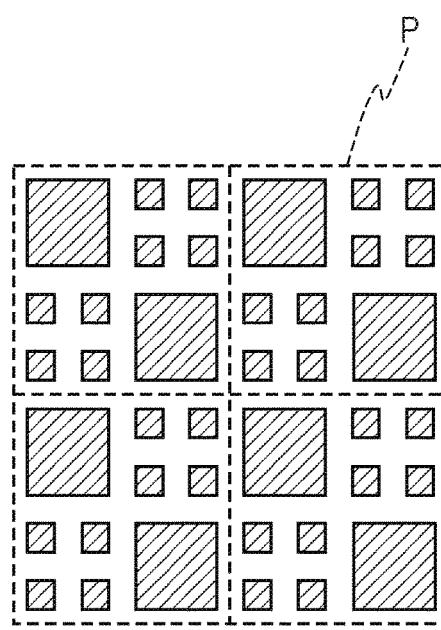
Figure 8A:
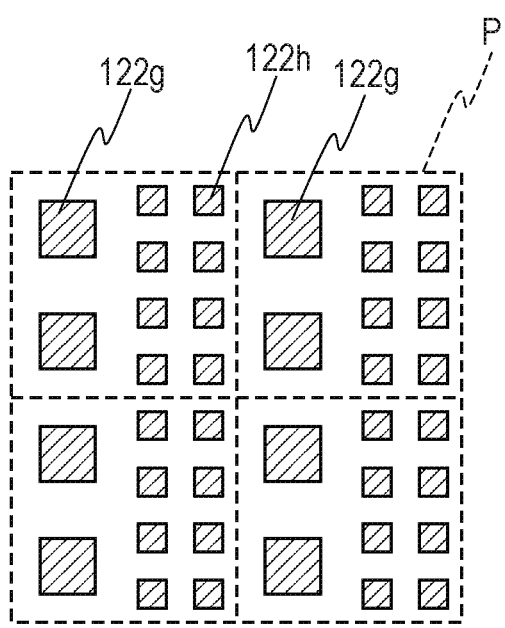
FIG. 8A and FIG. 8B are diagrams illustrating a modified example of a connection part of the photoelectric conversion device according to the first embodiment.
Figure 8B:
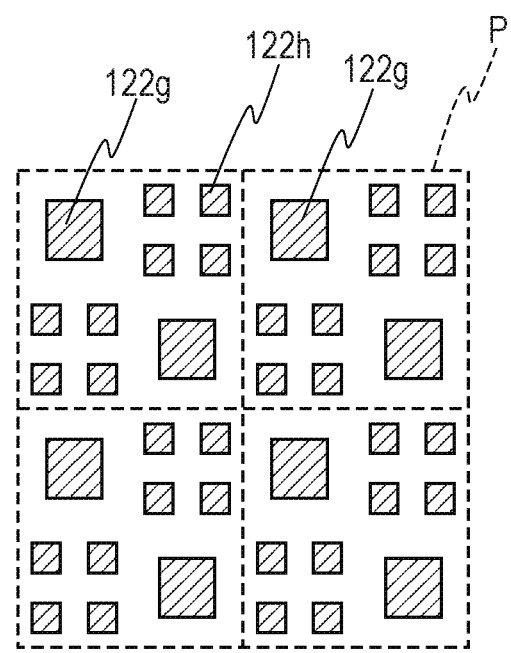

Similarly, FIG. 7B illustrates a modified example of FIG. 5B, FIG. 7C illustrates a modified example of FIG. 5C, FIG. 7D illustrates a modified example of FIG. 5D, FIG. 8A illustrates a modified example of FIG. 6A, and FIG. 8B illustrates a modified example of FIG. 6B. According to such a configuration, the planar evenness may be further improved.

Note that, while the expression "the same" is used above, the term "the same" does not require complete equality in a strict sense. For example, with respect to a certain value, "the same" can apply to a range of values from 90% to 110% of the certain value. Alternatively, "the same" can apply to a range of values from 95% to 105% of the certain value. Alternatively, even when there is variation such as a design error or a manufacturing error, "the same" can apply as long as the intended advantage is obtained. The same applies to embodiments and examples described below.

Further, the conditions described above are not required to be satisfied in the entire junction interface 100 in the photoelectric conversion region 401 as long as they are satisfied in a particular region. For example, the conditions described above may be satisfied in a pixel array of 10 rows by 10 columns.

The features described above will also be applied to examples and embodiments described below.

First Example

In the following example, a specific configuration example of a connection part that connects the first chip 101 and the second chip 201 to each other will be described.

Figure 9:
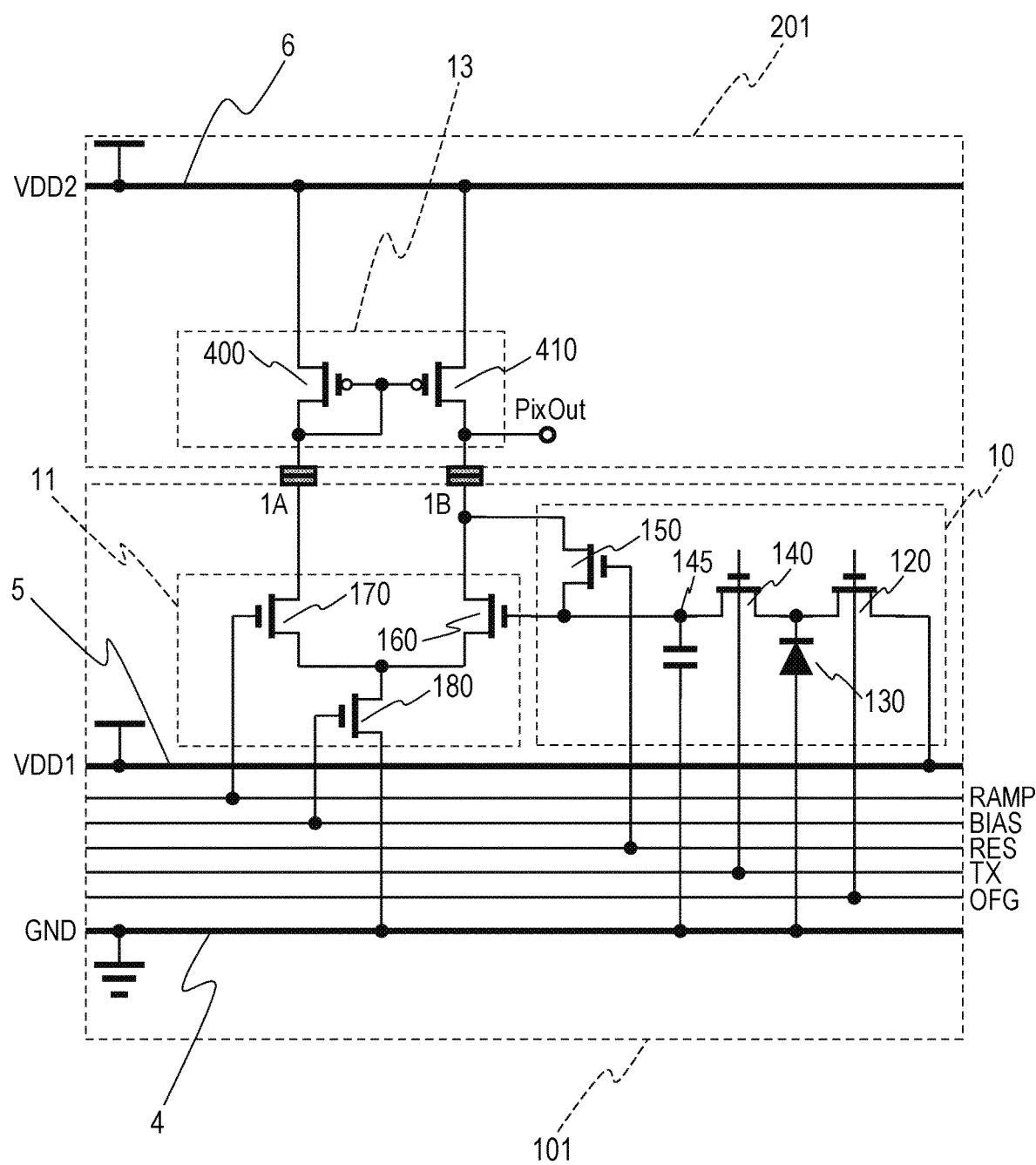
FIG. 9 is an equivalent circuit diagram of the photoelectric conversion device according to a first example.

FIG. 9 is a diagram illustrating an equivalent circuit of a pixel disposed in the photoelectric conversion region. The signal charge processing circuit 10 includes a charge drain transistor 120, a transfer transistor 140, and a reset transistor 150. Each of these transistors may be referred to as a pixel transistor. In FIG. 9, a PMOS transistor is represented by a circle being disposed to the gate, and an NMOS transistor is represented by no circle being disposed to the gate.

The charge drain transistor 120 is connected to the photoelectric conversion unit 130. The charge drain transistor 120 drains signal charges generated by the photoelectric conversion unit 130 to a power source line 5 (power source line VDD1) in response to a control signal input to the gate from a drive line OFG.

The transfer transistor 140 is connected to the input node of the photoelectric conversion unit 130 and the differential-pair circuit 11. The transfer transistor 140 transfers signal charges generated by the photoelectric conversion unit 130 to the input node of the differential-pair circuit 11 in response to a control signal input to the gate from a drive line TX.

The reset transistor 150 is connected to the input node of the differential-pair circuit 11. The reset transistor 150 resets the voltage of the input node of the differential-pair circuit 11 to the initial value in response to a control signal input from a drive line RES. In the present embodiment, the drain of the reset transistor 150 is connected to the drain of the input transistor 160 of the differential-pair circuit 11.

The differential-pair circuit 11 includes the input transistor 160 and the reference transistor 170.

Each of the input transistor 160 and the reference transistor 170 is an NMOS transistor. The source of the input transistor 160 and the source of the reference transistor 170 are connected to the current source 180 (load transistor 180). The load transistor 180 is connected to the power source line 4 (power source line GND), and a predetermined voltage is input to the gate via the wiring BIAS. The input transistor 160 and the reference transistor 170 form a differential pair by such a connection.

The input transistor 160 receives a signal based on signal charges generated by the photoelectric conversion unit 130. That is, the gate of the input transistor 160 is the input node of the differential-pair circuit 11. The gate of the reference transistor 170 is supplied with a ramp signal from a control ramp signal generation circuit (not illustrated) via the wiring RAMP.

The current mirror circuit 13 includes a transistor 400 and a transistor 410. Each of the transistor 400 and the transistor 410 is a PMOS transistor. The gate of the transistor 400 and the gate of the transistor 410 are connected to each other. The drain of the transistor 400 is connected to the reference transistor 170, and the drain of the transistor 410 is connected to the input transistor 160. Further, the gate and the drain of the transistor 400 are connected to each other. Furthermore, the source of the transistor 400 and the source of the transistor 410 are connected to a power source line VDD2.

The differential-pair circuit 11 and the current mirror circuit 13 form a comparator by the connection illustrated in FIG. 9. In response to inversion of the level relationship between the potential of the gate of the input transistor 160 and the potential of the gate of the reference transistor 170, the potential of the output node PixOut of the comparator (the drain of the transistor 410) changes. When the potential of the gate of the input transistor 160 is higher than the potential of the gate of the reference transistor 170, the potential of the output node of the comparator is at a low level. On the other hand, when the potential of the gate of the input transistor 160 is lower than the potential of the gate of the reference transistor 170, the potential of the output node of the comparator is at a high level.

The ramp signal input to the gate of the reference transistor 170 changes from a high voltage to a low voltage. Thus, at certain time, the potential of the output node of the comparator changes from a high level to a low level. A period from the time when the ramp signal starts changing to the time when the potential of the output node of the comparator changes is determined in accordance with the height of the potential of the gate of the input transistor 160, that is, the level of a signal based on charges generated by the photoelectric conversion unit 130. Thus, by counting or measuring this period, it is possible to convert a signal based on charges generated by the photoelectric conversion unit 130 into a digital signal.

When the reset transistor 150 is in an on-state, the differential-pair circuit 11 and the current mirror circuit 13 function as a voltage follower circuit. Thus, the potential of the gate of the input transistor 160 can be reset to any value in accordance with the potential of the ramp signal.

In FIG. 9, the differential-pair circuit 11 is disposed in the first chip 101, and the current mirror circuit 13 is disposed in the second chip 201. Further, the connection parts 1A and 1B between chips are disposed between the differential-pair circuit 11 and the current mirror circuit 13.

For example, with reference to FIG. 1A, the connection part 1A is the wirings 122a and 223a disposed in the photoelectric conversion region 401. Similarly, the connection part 1B is the wirings 122a and 223a disposed in the photoelectric conversion region 401. In such a way, "connection part" may mean one of the wirings in contact at the junction interface 100 or may mean both of the wirings in contact with each other at the junction interface 100. The latter is employed in the description of the present embodiment.

The areas of the connection parts 1A and 1B are smaller than the area of the connection part disposed in the peripheral region 402. Such a configuration provides an advantage of no excessive load (parasitic capacitance) being disposed to the wiring used for pixel output and no delay of a pulse signal being generated.

Further, in the present example, a connection part disposed in the peripheral region 402 may be a connection part used for transmitting a voltage supplied to the second chip 201 or a signal generated by the second chip 201 to the first chip 101. For example, while drive lines OFG, TX, RES, and the like are arranged in the row direction in the first chip 101 in FIG. 9, signal pulses transmitted through these drive lines may be generated in the second chip 201. In this case, the signal pulse generated in the second chip 201 is transmitted to the first chip 101 via the connection parts such as the wirings 112b and 223b of FIG. 1A.

Further, a voltage input to the second chip 201 or a voltage generated in the second chip 201 may be supplied to the power source line VDD1 or the power source line GND disposed in the first chip 101. In such a case, a voltage is supplied to the power source line VDD1 or the power source line GND disposed in the first chip 101 from the second chip 201 side via the connection parts such as the wirings 122b and 223b of FIG. 1A. When the connection parts between chips are used for supplying power source line, a lower electrical resistance is desirable. Thus, the area of the connection part arranged in the peripheral region 402 is preferably larger than the area of the connection part arranged in the photoelectric conversion region 401.

FIG. 1A is a schematic diagram, which illustrates an example in which one connection part (wirings 122a and 223a) is disposed for one pixel. That is, the pixel pitch is the same as the pitch of the connection parts. When one FD is shared by two photoelectric conversion units, there is one output path from FD for the two photoelectric conversion units. Thus, when the first chip and the second chip are connected on the immediate post-stage of the FD, the pitch of the connection parts can be half the pitch of pixels. The same applies to a case where the first chip and the second chip are not connected on the immediate post-stage of the FD. That is, while two connection parts 1A and 1B are disposed to one photoelectric conversion unit 130 in FIG. 9, when one FD 145 is shared by two photoelectric conversion units 130, the connection part 1A can be disposed to a first pixel, and the connection part 1B can be disposed to a second pixel. With such a configuration, the pixel pitch can be the same as the pitch of the connection parts 1A and 1B.

In the present example, with respect to connection parts of the first chip and the second chip, the area of the connection part of the photoelectric conversion region is smaller than the area of the connection part of the peripheral region. Thereby, the wiring capacitance is smaller at the connection part of the photoelectric conversion region, and the electrical resistance is lower at the connection part in the peripheral region. Thereby, in a photoelectric conversion device in which a plurality of semiconductor layers are stacked, a photoelectric conversion device with improved reliability can be disposed.

Second Example

Figure 10:
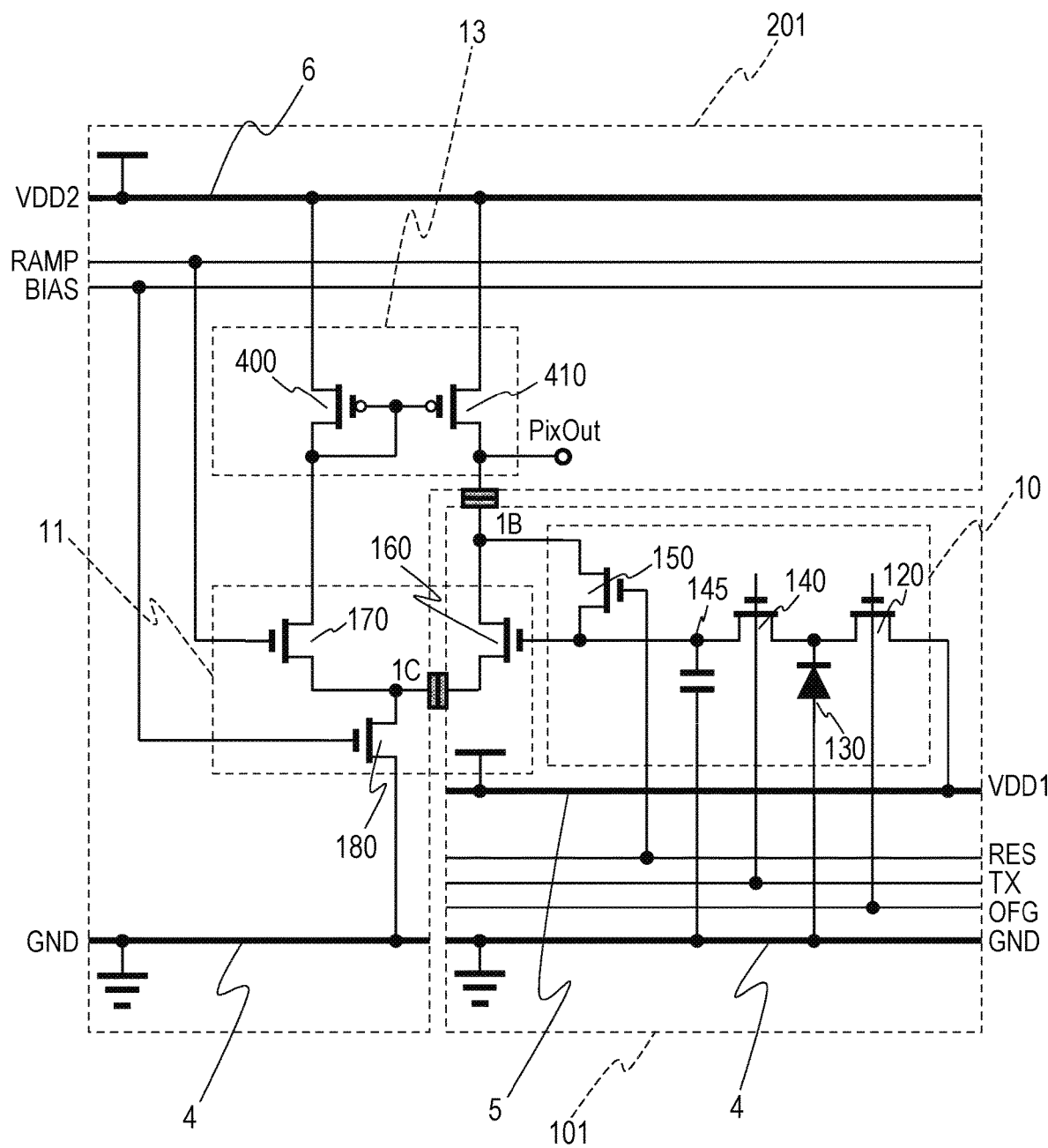
FIG. 10 is an equivalent circuit diagram of the photoelectric conversion device according to a second example.

FIG. 10 is an equivalent circuit diagram according to the present example, and since the circuit diagram and the operation are the same as those in FIG. 9, the description thereof will be omitted.

In the first example, both the connection parts are disposed between the differential-pair circuit 11 and the current mirror circuit 13. The present example and the first example are the same in that one connection part is disposed between the differential-pair circuit 11 and the current mirror circuit 13. As illustrated in FIG. 10, however, there is a difference that the other connection part is disposed between an input transistor 160 and a reference transistor 170 that form the differential-pair circuit 11. Therefore, while the wiring RAMP and the wiring BIAS are arranged extending in the photoelectric conversion region of the first chip 101 in the first example, these wirings are arranged extending in the photoelectric conversion region of a second chip 201 in the present example.

In the present example, each of the areas of the connection parts 1B and 1C arranged in the photoelectric conversion region is smaller than the area of a connection part arranged in the peripheral region. This has an advantage of no excessive load being disposed on the pixel output. Further, as with the first example, the voltage of the power source line of the pixel transistor of the first chip 101 may be supplied from the second chip 201 via a connection part arranged in the peripheral region. In such a case, the electrical resistance at the connection part in the peripheral region can be reduced. As described above, in the photoelectric conversion device in which a plurality of semiconductor layers are stacked, a photoelectric conversion device with further improved characteristics can be disposed.

Third Example

Figure 11:
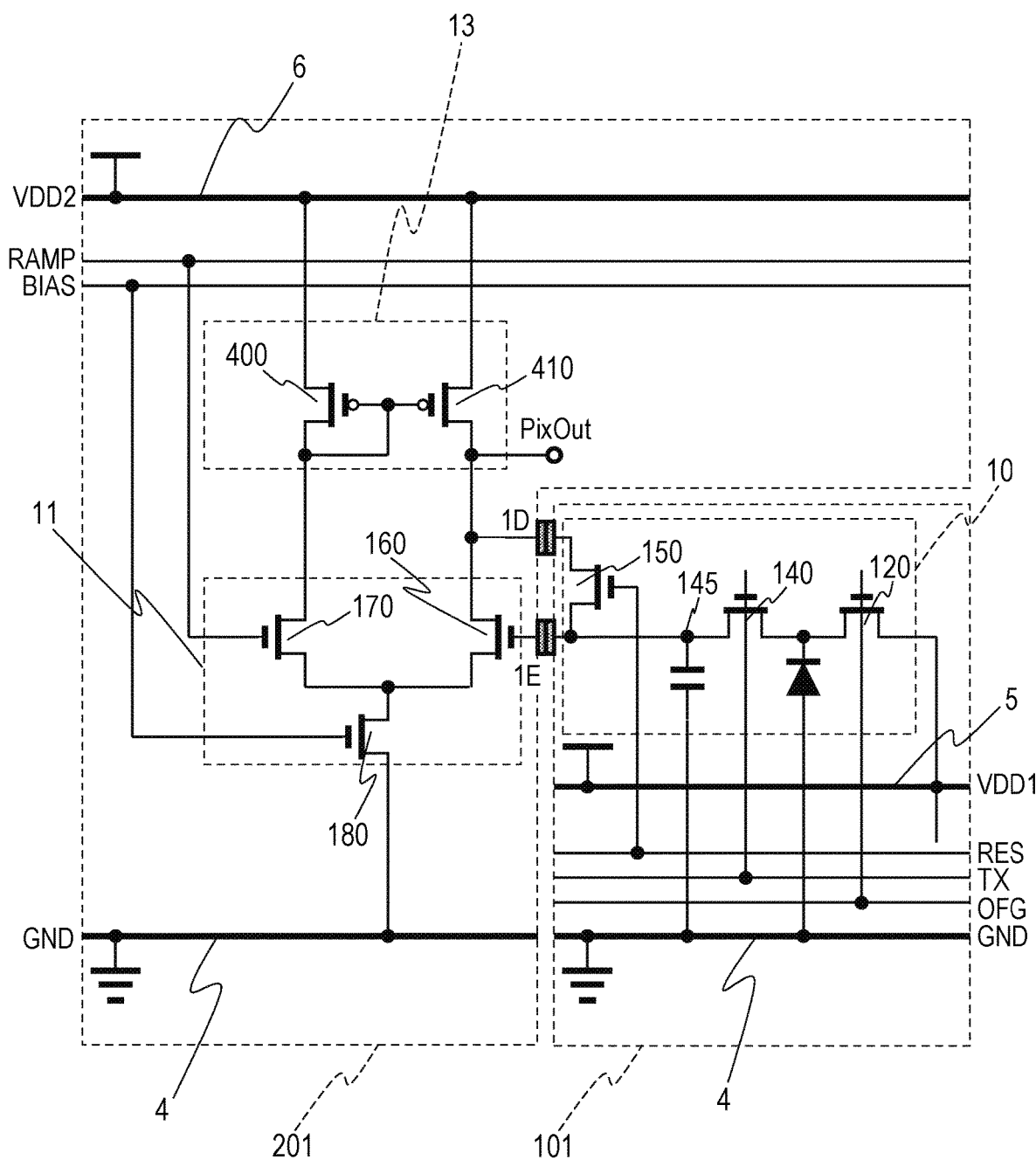
FIG. 11 is an equivalent circuit diagram of the photoelectric conversion device according to a third example.

FIG. 11 is an equivalent circuit diagram according to the present example, and since the circuit diagram and the operation are the same as those in FIG. 9 and FIG. 10, the description thereof will be omitted.

In the first and second examples, at least one connection part is disposed between the differential-pair circuit 11 and the current mirror circuit 13. However, the present example is different from the examples described above in that both the connection parts are disposed between the FD 145 and the differential-pair circuit 11.

In the present example, each of the connection parts 1D and 1E arranged in the photoelectric conversion region is smaller than the area of the connection part arranged in the peripheral region. This has an advantage of no excessive load being disposed on the pixel output. Further, in particular, the connection part 1E is a connection part directly connected to the FD 145, and the wiring capacitance is preferably reduced as much as possible to reduce noise. Therefore, according to the present example, there is an advantage of noise reduction. Further, as with the first example and the second example, the voltage of the power source line of the pixel transistor of the first chip 101 may be supplied from the second chip 201 via a connection part arranged in the peripheral region. In such a case, the electrical resistance at the connection part in the peripheral region can be reduced. As described above, in the photoelectric conversion device in which a plurality of semiconductor layers are stacked, a photoelectric conversion device with further improved characteristics can be disposed.

Fourth Example

Figure 12:
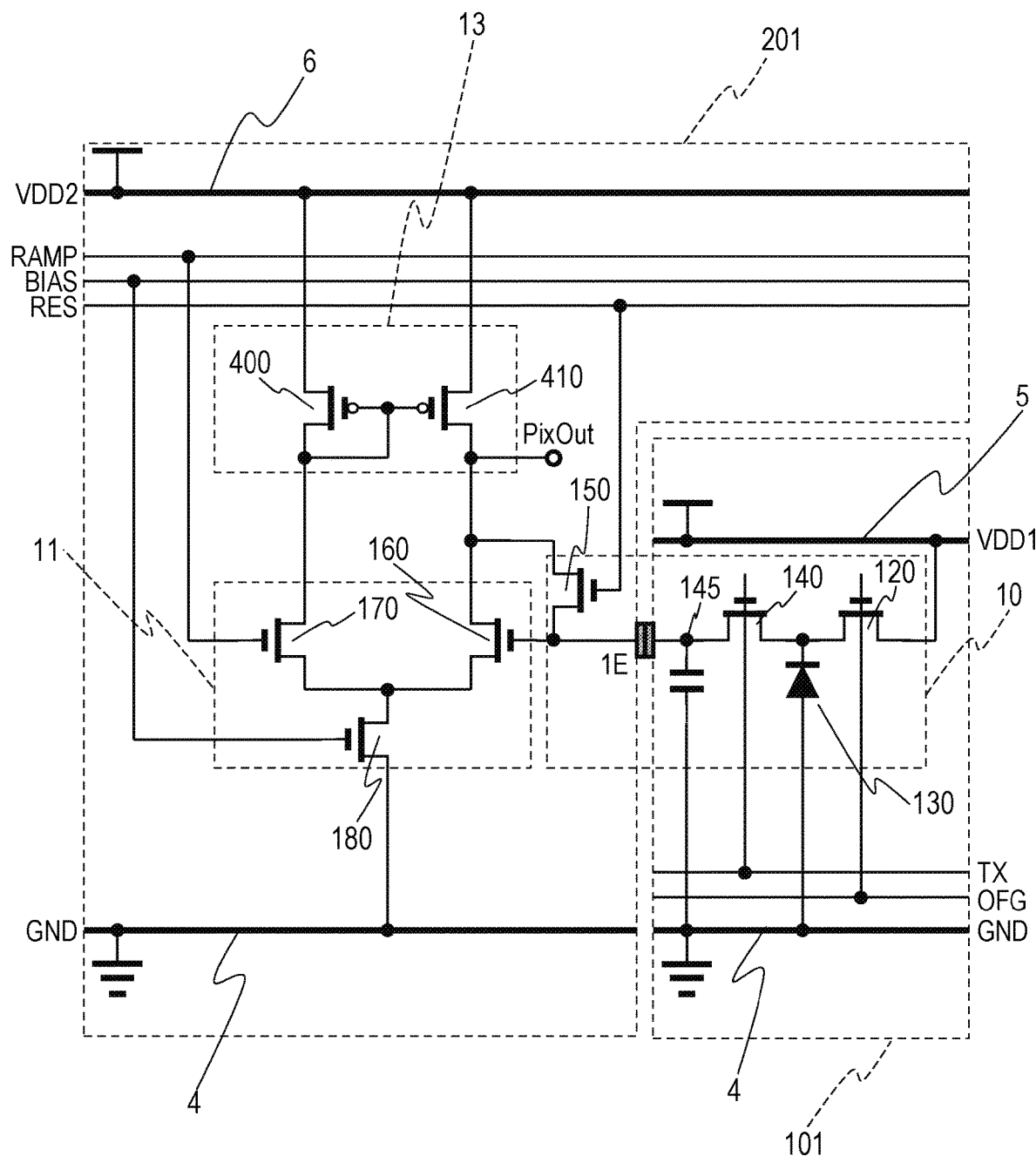
FIG. 12 is an equivalent circuit diagram of the photoelectric conversion device according to a fourth example.

FIG. 12 is an equivalent circuit diagram according to the present example, and since the circuit diagram and the operation are the same as those in FIG. 9 to FIG. 11, the description thereof will be omitted.

In the present example, the reset transistor 150 is disposed not on the first chip 101 side but on the second chip 201 side. Therefore, only the single connection part is required to be disposed in the present example, while two connection parts are disposed in the third example. That is, the number of connection parts can be reduced, and thereby a photoelectric conversion device that can suppress a contact failure or the like in manufacturing can be disposed.

Further, while the drive line RES is arranged extending in the photoelectric conversion region of the first chip 101 in the third example, the drive line RES is arranged extending in the photoelectric conversion region of the second chip 201 in the present example.

In the present example, the connection part 1E arranged in the photoelectric conversion region is smaller than the area of the connection part arranged in the peripheral region. The connection part 1E is a connection part directly connected to the FD 145, and the wiring capacitance is preferably reduced as much as possible to reduce noise. Therefore, according to the present example, there is an advantage of noise reduction. Further, as with the first example to the third example, the voltage of the power source line of the pixel transistor of the first chip 101 may be supplied from the second chip 201 via the connection part arranged in the peripheral region. In such a case, the electrical resistance at the connection part in the peripheral region can be reduced. As described above, in the photoelectric conversion device in which a plurality of semiconductor layers are stacked, a photoelectric conversion device with further improved characteristics can be disposed.

Fifth Example

Figure 13:
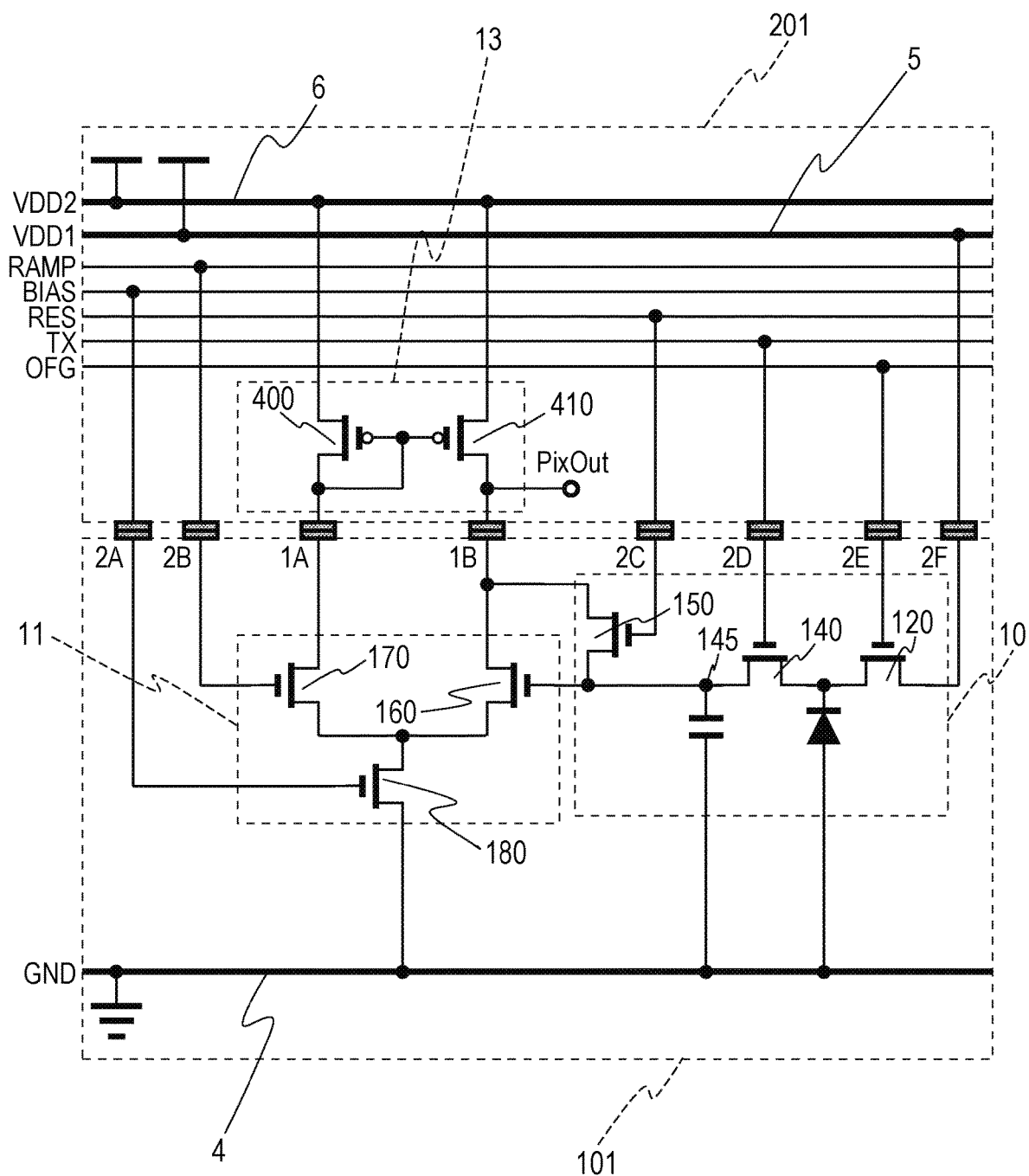
FIG. 13 is an equivalent circuit diagram of the photoelectric conversion device according to a fifth example.

FIG. 13 is an equivalent circuit diagram according to the present example, and since the circuit diagram and the operation are the same as those in FIG. 9 to FIG. 12, the description thereof will be omitted.

The present example is different from the first example to the fourth example in that a control signal is input to the gates of all the transistors disposed in the signal charge processing circuit 10 via the connection parts of the first chip and the second chip. Specifically, an input signal to the gates of the charge drain transistor 120, the transfer transistor 140, or the reset transistor 150 is supplied from the drive line RES, the drive line TX, or the drive line OFG via the connection parts 2C to 2F.

Further, the wiring BIAS and the wiring RAMP that supply a voltage input to the gates of the load transistor 180 and the reference transistor 170 disposed in the differential-pair circuit 11 are arranged extending in the photoelectric conversion region of the second chip 201. The voltages of the wiring BIAS and the wiring RAMP are configured to be input to the load transistor 180 and the reference transistor 170 via the connection parts 2A and 2B, respectively.

Further, the connection parts 1A and 1B are used for the connection between the differential-pair circuit 11 and the current mirror circuit 13 in the same manner as the first example.

In the present example, each of the areas of the connection parts 1A and 1B is smaller than the area of the connection part disposed in the peripheral region 402. This has an advantage of no excessive load being disposed on the pixel output.

Further, in the present example, each of the areas of the connection parts 2C to 2F is smaller than the area of the connection part disposed in the peripheral region 402. Thereby, the wiring capacitance can be reduced, and propagation delay of signals can be suppressed.

Further, in the present example, each of the areas of the connection parts 2D and 2E is preferably the same. The connection part 2D is a wiring connected to the drive line TX to operate the transfer transistor 140. Further, the connection part 2E is a wiring connected to the drive line OFG to operate the charge drain transistor 120. In the photoelectric conversion device, the charge accumulation time is controlled by the transfer transistor 140 and the charge drain transistor 120. Therefore, the same areas of the connection parts 2D and 2E can provide the same electrical resistances or the wiring capacitances.

In addition, in the present example, each of the areas of the connection parts 1A and 1B is preferably smaller than the areas of the connection parts 2D and 2E. As described above, this is because the areas of the connection parts 1A and 1B significantly contribute to the pixel output.

In addition, in the present example, the area of the connection part 2F is preferably larger than the areas of the connection parts 1A and 1B. Further, the area of the connection part 2F is preferably larger than the areas of the connection parts 2A to 2E. This is because the connection part 2F is a wiring connected to the power source line VDD1 and preferably has a lower electrical resistance.

As described above, in the photoelectric conversion device in which a plurality of semiconductor layers are stacked, a photoelectric conversion device with further improved characteristics can be disposed.

Sixth Example

Figure 14:
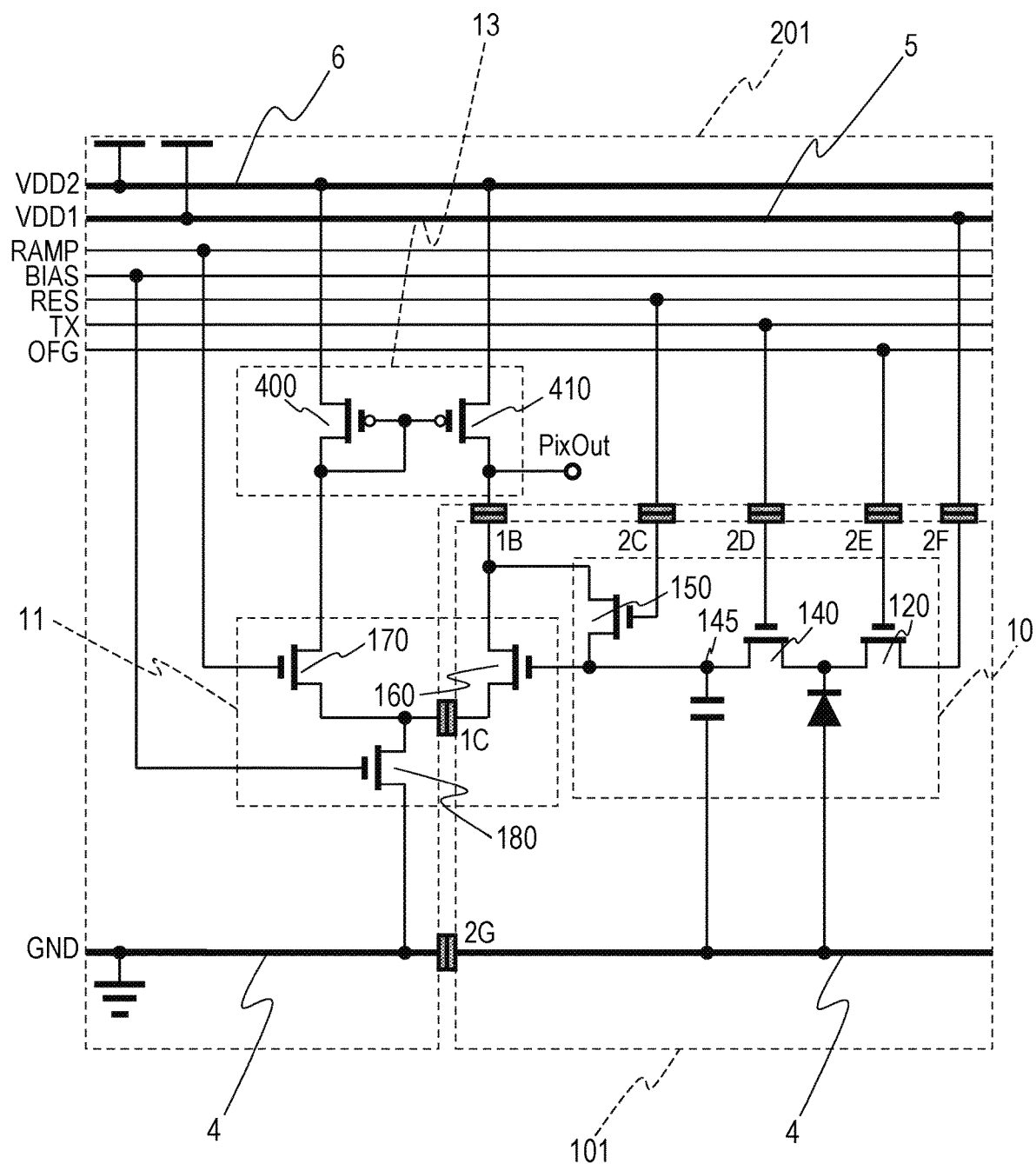
FIG. 14 is an equivalent circuit diagram of the photoelectric conversion device according to a sixth example.

FIG. 14 is an equivalent circuit diagram according to the present example, and since the circuit diagram and the operation are the same as those in FIG. 9 to FIG. 13, the description thereof will be omitted.

When compared to the second example to the fifth example, the present example is different in that the voltage of the power source line GND is supplied from the second chip 201 to the first chip 101 via a connection part.

In the present example, each of the areas of the connection parts 1B and 1C is preferably smaller than the area of a connection part disposed in the peripheral region 402. Alternatively, each of the areas of the connection parts 1B and 1C is preferably smaller than each of the areas of the connection parts 2F and 2G. This has an advantage of no excessive load being disposed on the pixel output.

Further, each of the areas of the connection parts 2F and 2G is preferably larger than each of the areas of the connection parts 2C to 2E. Alternatively, each of the areas of the connection parts 2F and 2G is preferably larger than each of the areas of the connection parts 1B and 1C. The connection part 2F is a wiring connected to the power source line VDD1, and the connection part 2G is a wiring connected to the power source line GND. Therefore, increase of the area of these wirings provides an advantage of reduction in the wiring resistance.

Further, as with the fifth example, the areas of the connection parts 2D and 2E are preferably the same.

As described above, in the photoelectric conversion device in which a plurality of semiconductor layers are stacked, a photoelectric conversion device with further improved characteristics can be disposed.

Seventh Example

Figure 15:
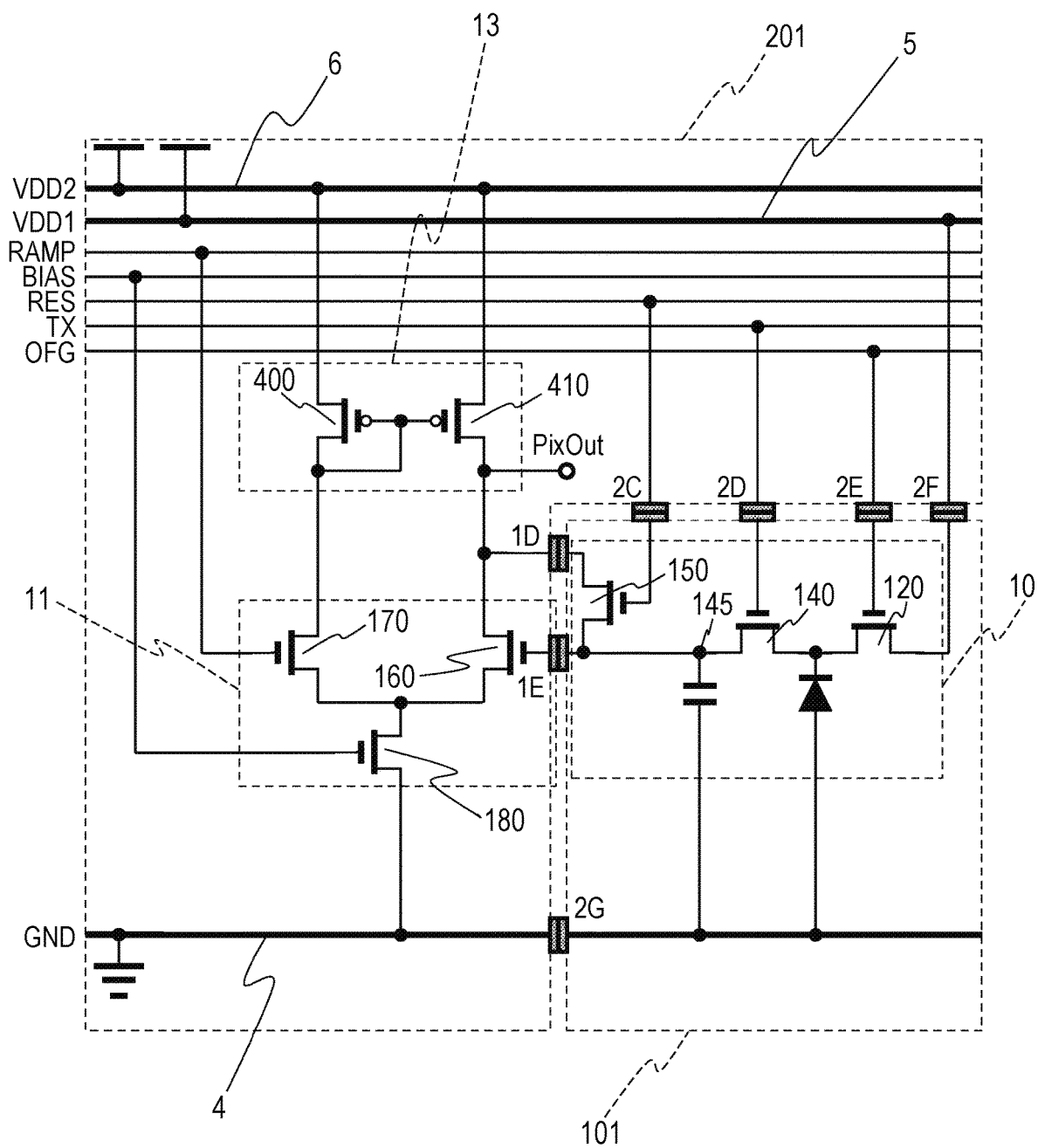
FIG. 15 is an equivalent circuit diagram of the photoelectric conversion device according to a seventh example.

FIG. 15 is an equivalent circuit diagram according to the present example, and since the circuit diagram and the operation are the same as those in FIG. 9 to FIG. 14, the description thereof will be omitted.

The present example is based on the sixth example. However, the present example is different from the sixth example in that both the chips are not connected at the connection parts 1B and 1C in the sixth example but connected at the connection parts 1D and 1E described in the third example.

In the present example, each of the areas of the connection parts 1D and 1E is preferably smaller than the area of a connection part disposed in the peripheral region. Alternatively, each of the areas of the connection parts 1D and 1E is preferably smaller than each of the areas of the connection parts 2F and 2G. Alternatively, each of the areas of the connection parts 1D and 1E is preferably smaller than each of the areas of the connection parts 2C to 2F. This has an advantage of no excessive load being disposed on the pixel output.

Further, each of the areas of the connection parts 2F and 2G is preferably larger than each of the areas of the connection parts 1D and 1E. Increase of the areas of these wirings provides an advantage of reduction in the wiring resistance.

As described above, in the photoelectric conversion device in which a plurality of semiconductor layers are stacked, a photoelectric conversion device with further improved characteristics can be disposed.

Eighth Example

Figure 16:
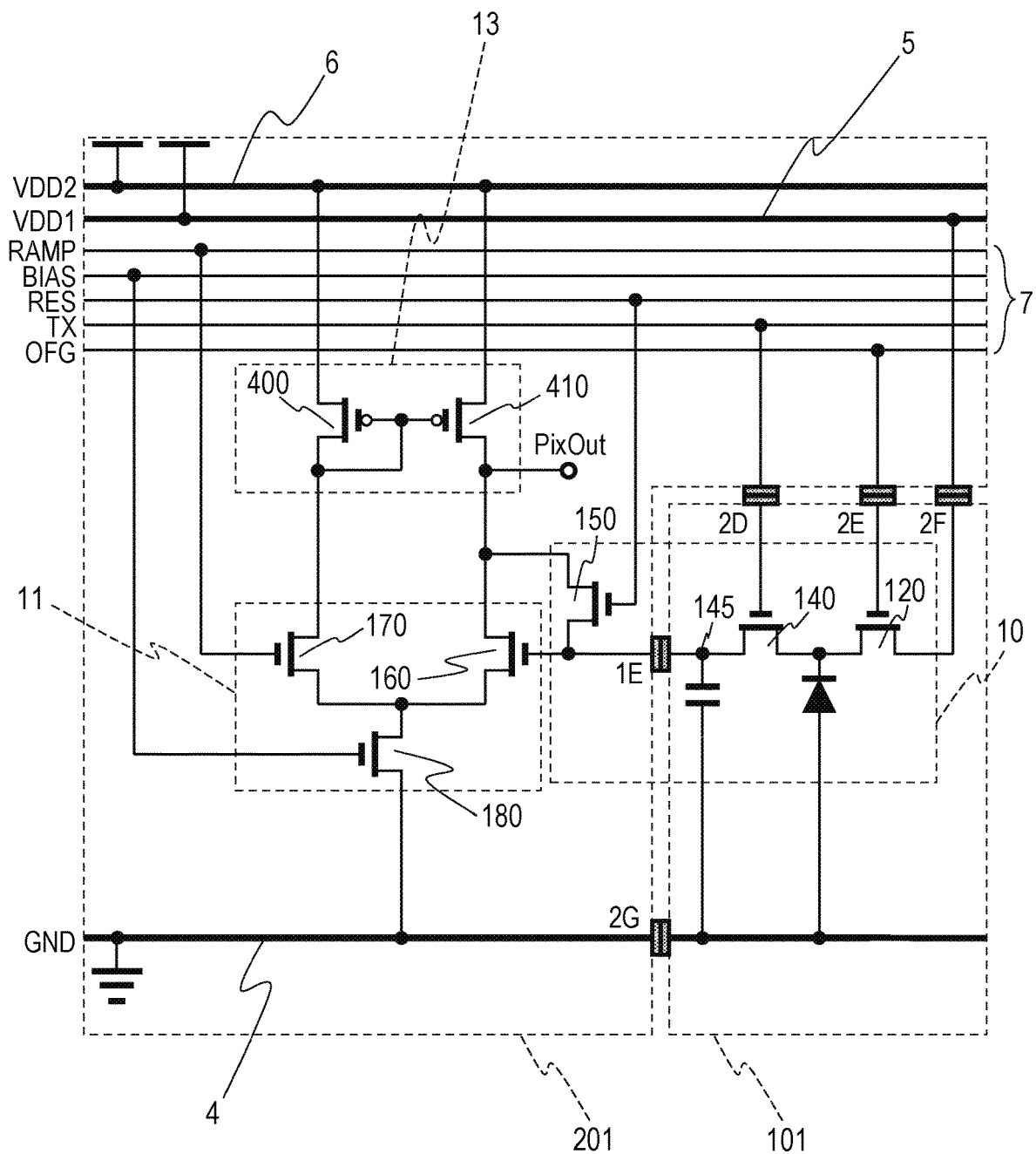
FIG. 16 is an equivalent circuit diagram of the photoelectric conversion device according to an eighth example.

FIG. 16 is an equivalent circuit diagram according to the present example, and since the circuit diagram and the operation are the same as those in FIG. 9 to FIG. 15, the description thereof will be omitted.

While both the chips are connected between the reset transistor and the differential-pair circuit 11 in the seventh example, the present example is different in that both the chips are connected between the FD 145 and the differential-pair circuit 11.

In the present example, the area of the connection part 1E is smaller than the area of a connection part disposed in the peripheral region. Alternatively, the area of the connection part 1E is smaller than the areas of the connection parts 2D to 2F. Alternatively, the area of the connection part 1E is smaller than the area of the connection part 2G. This has an advantage of noise reduction.

As described above, in the photoelectric conversion device in which a plurality of semiconductor layers are stacked, a photoelectric conversion device with further improved characteristics can be disposed.

Ninth Example

Figure 17:
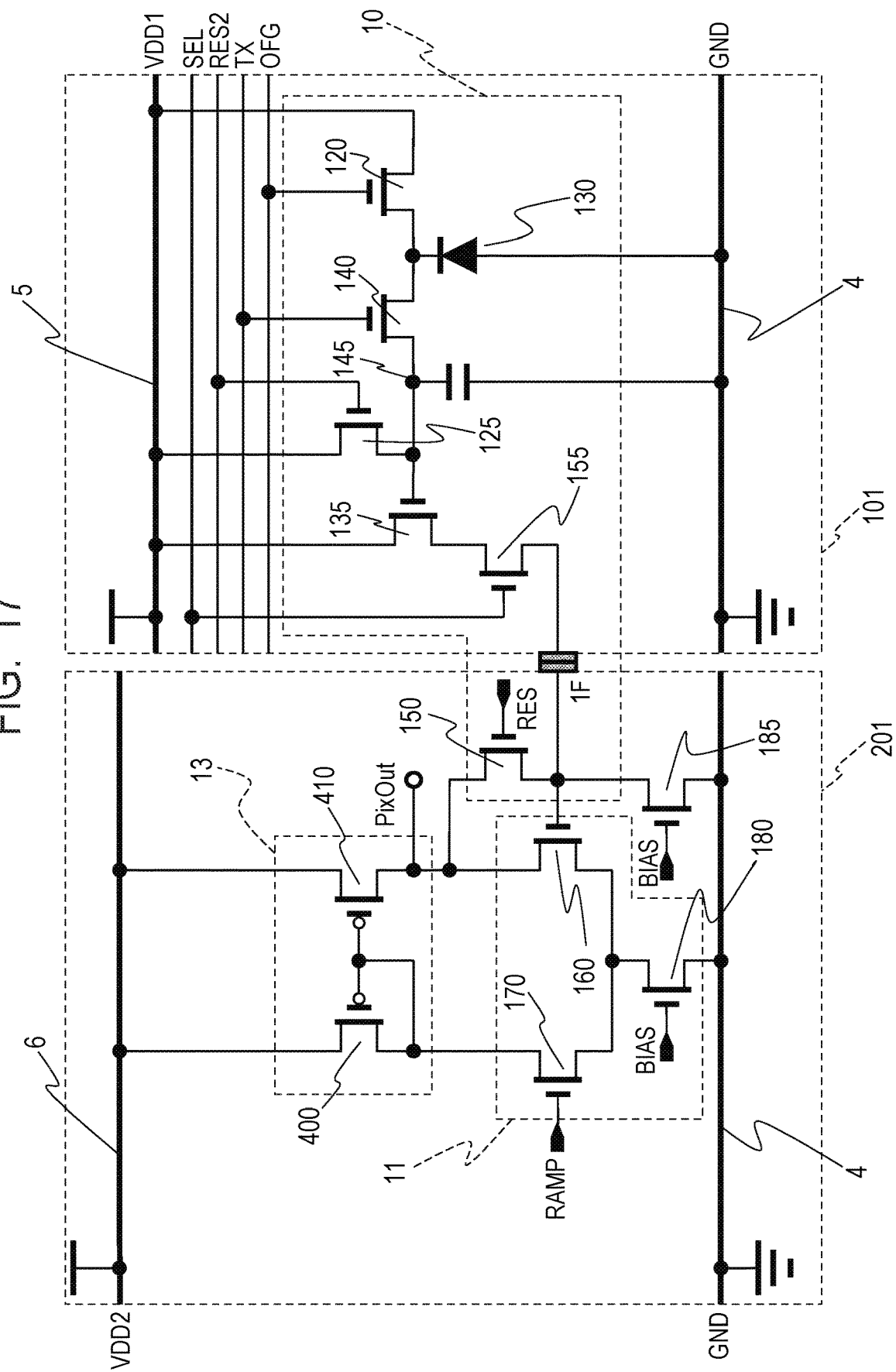
FIG. 17 is an equivalent circuit diagram of the photoelectric conversion device according to a ninth example.

FIG. 17 is an equivalent circuit diagram according to the present example. Components labeled with the same reference through FIG. 9 to FIG. 16 are the components having the same function. Illustration of the drive line to drive the transistor disposed to the second chip 201 is omitted in FIG. 17.

In the present example, a reset transistor 125, an amplification transistor 135, a selection transistor 155, and a current source 185 (a load transistor 185) are additionally disposed. The reset transistor 125 is connected to the FD 145 and the power source line 5 (power source line VDD1). The reset transistor 125 resets the potential of the FD 145 in response to a control signal input from a drive line RES2. The amplification transistor 135 outputs a signal corresponding to the potential of the FD 145. The selection transistor 155 is connected to the amplification transistor 135 and the input transistor 160 and selects a pixel row to be output to the input transistor 160 in response to a control signal input from a drive line SEL. The load transistor 185 is connected to the power source line 4 (power source line GND) and functions as a current source for the amplification transistor 135.

In the present example, the connection part 1F is disposed at the part in which the selection transistor 155 is connected to the input transistor 160. Therefore, in the present example, the area of the connection part 1F is preferably smaller than the area of a connection part disposed in the peripheral region. This has an advantage of no excessive load being disposed on the pixel output. Further, the voltage of the power source line of the pixel transistor of the first chip 101 may be supplied by the second chip 201 via a connection part disposed in the peripheral region. In such a case, the electrical resistance at the connection part in the peripheral region can be reduced.

As described above, in the photoelectric conversion device in which a plurality of semiconductor layers are stacked, a photoelectric conversion device with further improved characteristics can be disposed.

Tenth Example

Figure 18:
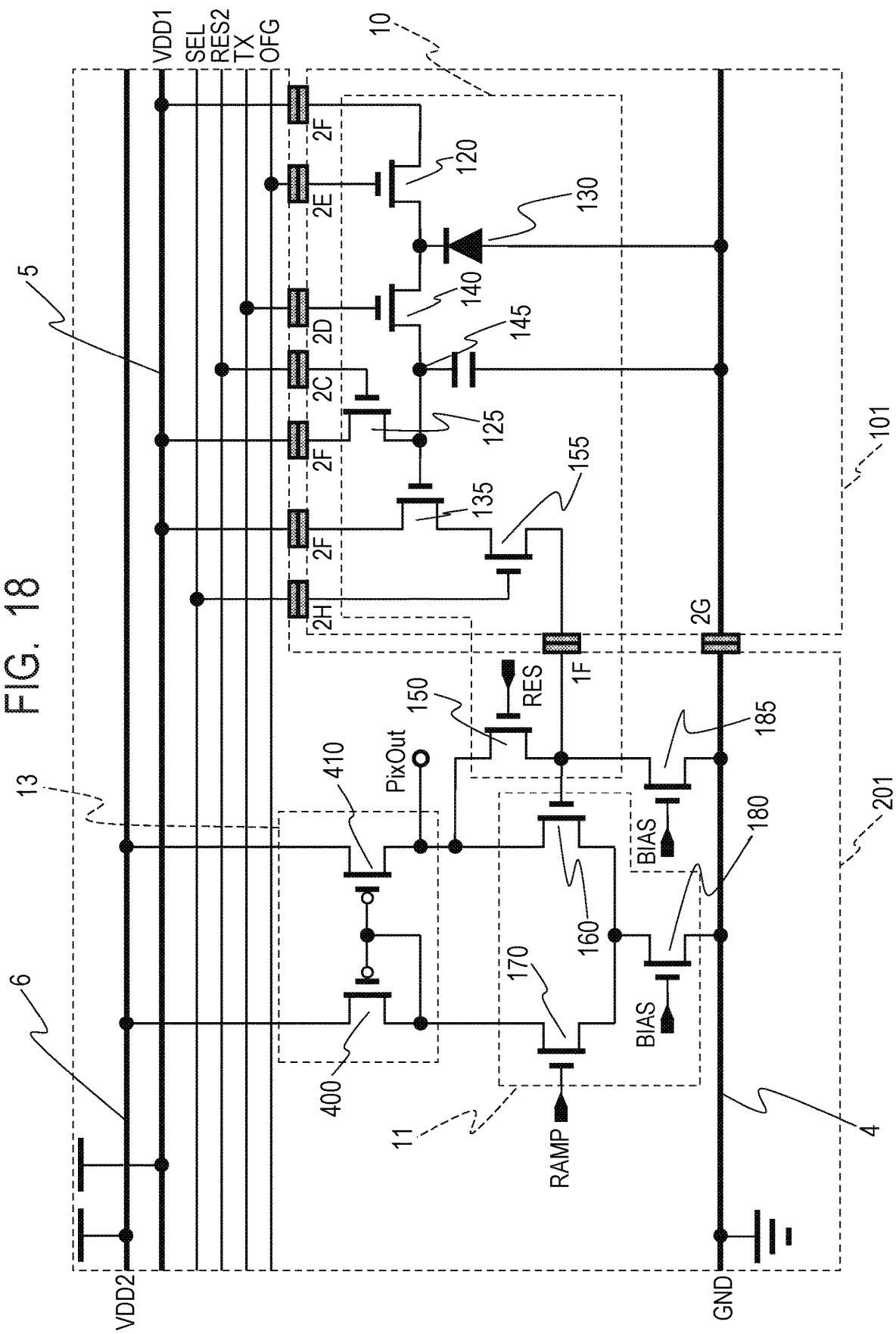
FIG. 18 is an equivalent circuit diagram of the photoelectric conversion device according to a tenth example.

FIG. 18 is an equivalent circuit diagram according to the present example, and since the circuit diagram and the operation are the same as those in FIG. 17, the description thereof will be omitted.

In the present example, the connection parts 2C, 2D, 2E, and 2H are disposed between the gates of the respective transistors disposed to the first chip 101 and the respective drive lines for transmitting a control signal to be input to the respective gate. Further, the connection part 2F is disposed between the charge drain transistor 120 and the power source line 5 (power source line VDD1) and between the amplification transistor 135 and the power source line VDD1. Furthermore, the connection part 2G is disposed between the power source line 4 (power source line GND) arranged in the first chip 101 and the power source line GND arranged in the second chip 201.

In the present example, the area of the connection part 1F is also preferably smaller than the area of a connection part disposed in the peripheral region. This has an advantage of no excessive load being disposed on the pixel output.

Further, each of the areas of the connection parts 2F and 2G is preferably larger than the area of the connection part 1F. Alternatively, each of the areas of the connection parts 2F and 2G is preferably larger than each of the areas of the connection parts 2C, 2D, 2E, and 2H. This is because increase of the areas of these wirings provides an advantage of reduction in wiring resistance.

Furthermore, the areas of the connection parts 2D and 2E are preferably the same. In the photoelectric conversion device, the charge accumulation time is controlled by the transfer transistor 140 and the charge drain transistor 120. Therefore, the same areas of the connection parts 2D and 2E can provide the same electrical resistances or the wiring capacitances.

As described above, in the photoelectric conversion device in which a plurality of semiconductor layers are stacked, a photoelectric conversion device with further improved characteristics can be disposed.

Second Embodiment: Photoelectric Conversion Device with Three-Layer Configuration The present embodiment is different from the embodiment and the examples described above in that a third chip 301 is stacked in addition to the first chip 101 and the second chip 201.

Figure 19:
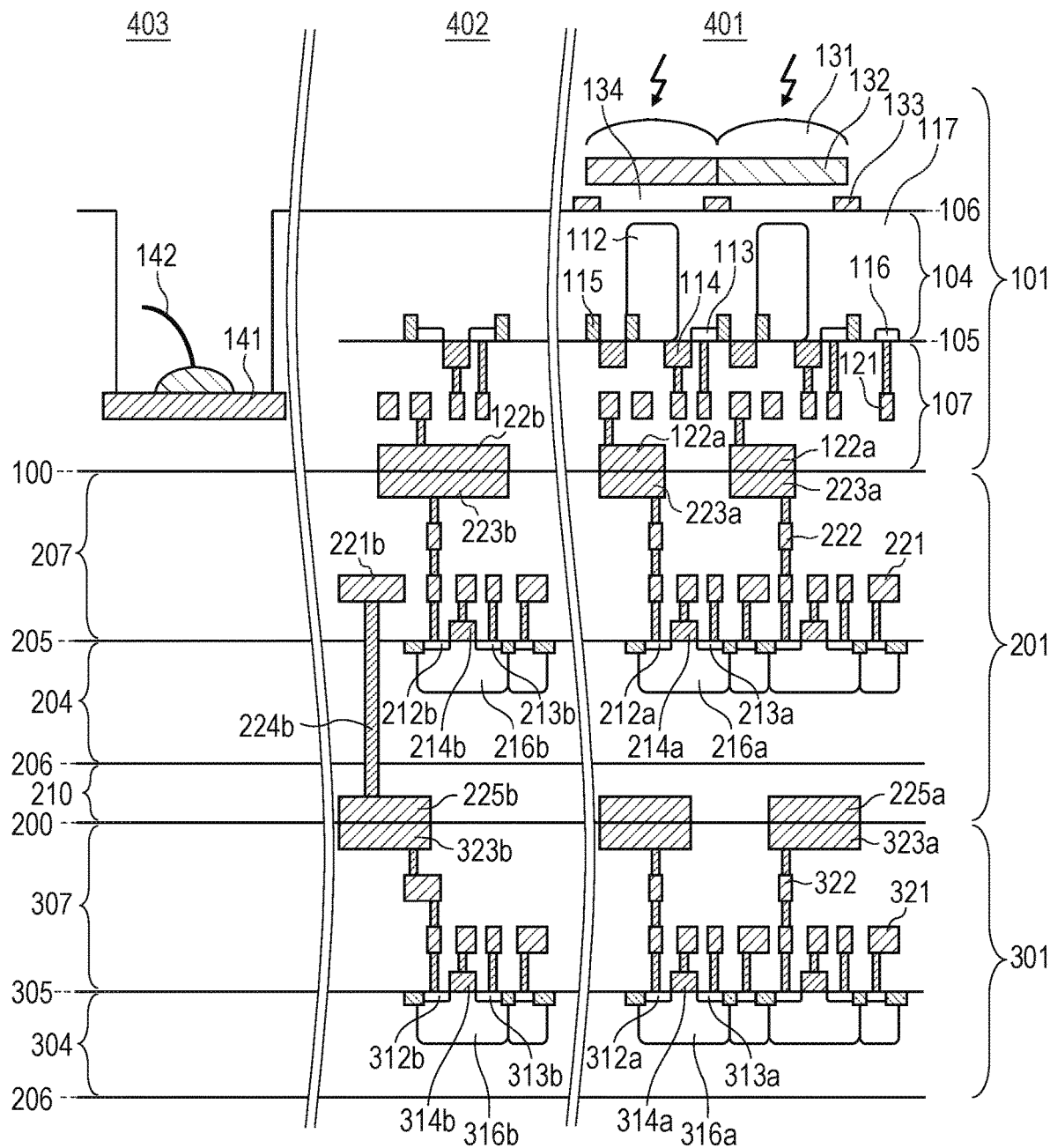
FIG. 19 is a sectional view of a photoelectric conversion device according to a second embodiment.

FIG. 19 is a sectional view of a photoelectric conversion device according to the present embodiment. In the present embodiment, the first chip 101 and the second chip 201 are stacked in the same manner as FIG. 1A.

A plurality of transistors are disposed to a third semiconductor layer 304 of the third chip 301. As components of a transistor disposed in the photoelectric conversion region 401, source/drain regions 312*a* and 313*a*, a gate electrode 314*a*, and a well region 316*a* are depicted. Further, as components of a transistor disposed in the peripheral region 402, source/drain regions 312*b* and 313*b*, a gate electrode 314*b*, and a well region 316*b* are depicted.

A third wiring structure 307 is disposed on the front face 305 side of the third semiconductor layer 304. That is, the third wiring structure 307 is disposed between the second wiring structure 207 and the third semiconductor layer 304. The third wiring structure 307 is formed of a plurality of insulating layers and a plurality of wiring layers. In the present embodiment, as a plurality of wiring layers, a wiring layer 321, a wiring layer 322, and a wiring layer 323 are disposed. In this example, a wiring 323*a* is a wiring disposed in the photoelectric conversion region 401, and a wiring 323*b* is a wiring disposed in the peripheral region 402. To provide electrical connection between the wiring layer 321 and each transistor, a contact plug is disposed. To provide electrical connection between wiring layers, for example, between the wiring layer 321 and the wiring layer 322, a via plug is disposed.

Further, a fourth wiring structure 210 is disposed between the backside face 206 of the second semiconductor layer 204 and the third wiring structure 307. The fourth wiring structure 210 is formed of a plurality of insulating layers and a plurality of wiring layers. A wiring 225a is disposed in the photoelectric conversion region 401, and a wiring 225b is disposed in the peripheral region 402. A through electrode 224b is disposed between a wiring 221b of the second wiring structure 207 and the wiring 225b. The through electrode 224b penetrates through the second semiconductor layer 204 made of a silicon layer, and therefore is also referred to as Through Silicon Via (TSV). At a junction interface 200 of the second chip 201 and the third chip 301, the wiring 225a is in contact with the wiring 232a, and the wiring 225b is in contact with the wiring 323b.

Figure 20A:
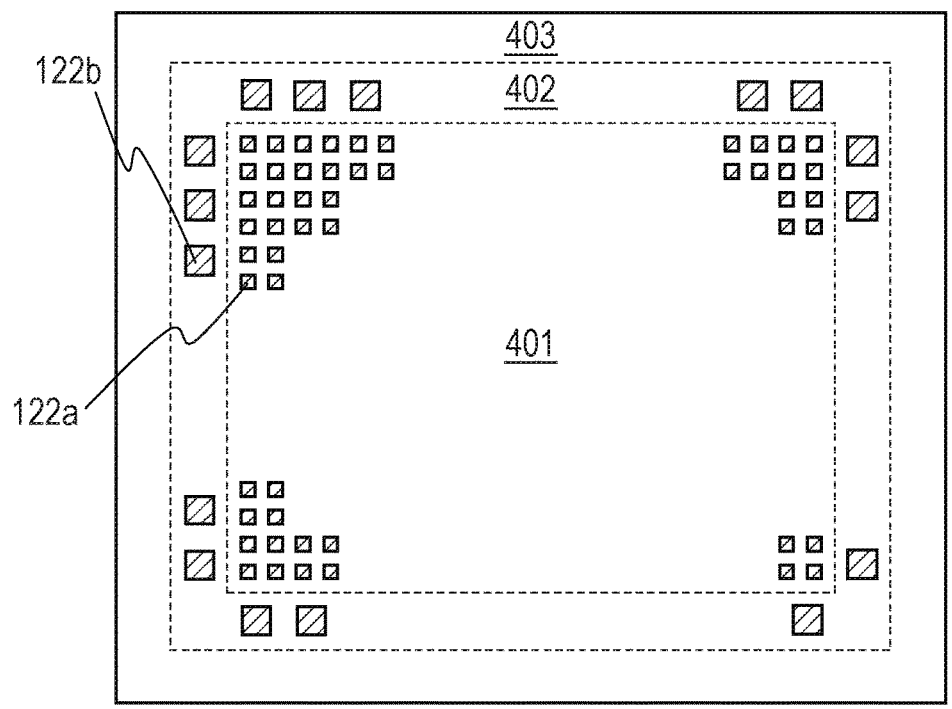
FIG. 20A and FIG. 20B are plan views of the photoelectric conversion device according to the second embodiment.

FIG. 20A is a plan view when the first chip 101 is observed from the second chip 201 at the junction interface 100 in FIG. 19, which illustrates the wiring 122a and the wiring 122b of the first wiring structure 107. In such a way, in a planar view, the area of the wiring 122a is configured to be smaller than the area of the wiring 122b. Further, although not illustrated, when the second chip 201 is observed from the first chip 101, the area of the wiring 223a of the second wiring structure 207 is configured to be smaller than the area of the wiring 223b. That is, in a planar view, the areas of the wiring 122a (first connection part) and the wiring 223a (second connection part) are smaller than the areas of the wiring 122b (third connection part) and the wiring 223b (fourth connection part). The advantage obtained when such a condition is satisfied is the same as the advantage described in the first embodiment.

Figure 20B:
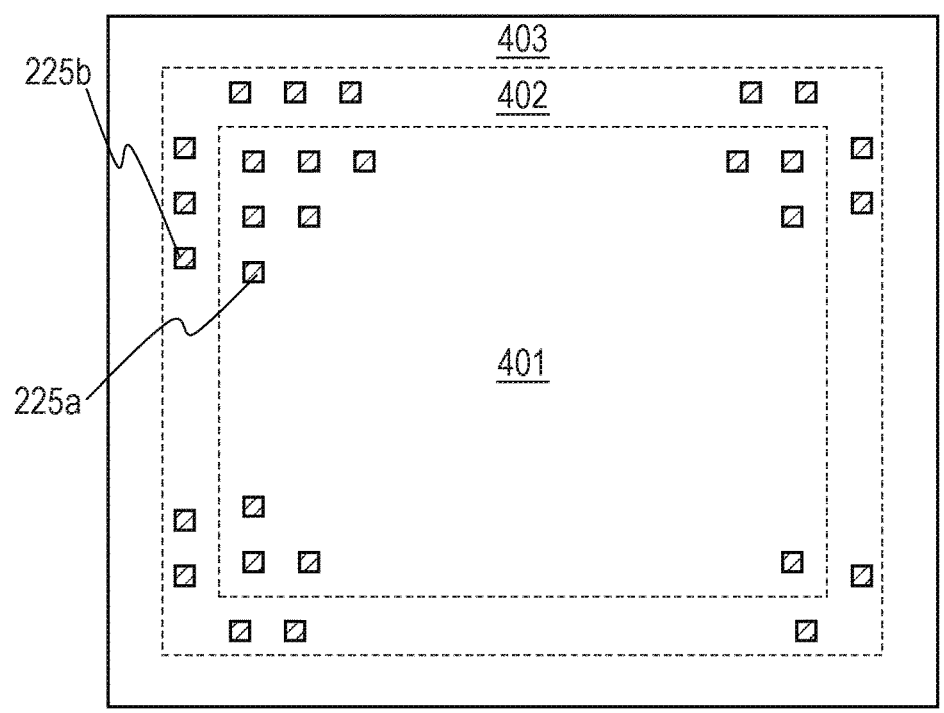

Further, FIG. 20B is a plan view when the second chip 201 is observed from the third chip 301 at the junction interface 200 in FIG. 19, which illustrates the wiring 225a and the wiring 225b of the fourth wiring structure 210. In such a way, the area of the wiring 225a is configured to be equal to the area of the wiring 225b in a planar view. Further, although not illustrated, when the first chip 101 is observed from the second chip 201, the area of the wiring 323a of the third wiring structure 307 is configured to be equal to the area of the wiring 323b. Such a configuration can equalize heat generation caused at the wirings at the junction interface between the second chip 201 and the third chip 301 over the entire chip. Therefore, local heat generation is less likely to occur, and deterioration of image quality can be reduced. In particular, when three or more chips are stacked, the chips held therebetween are generally formed thin, and thereby it is preferable to have even heat generation over the entire chip.

Further, as illustrated in FIG. 20A and FIG. 20B, each of the areas of the wiring 225a and the wiring 225b is larger than the wiring 122a and is smaller than the wiring 122b. Such a configuration can suppress the current density of a current flowing in the wiring to a lower level and can form more connection parts while further reducing local heat generation. The size of the connection part can be appropriately selected in accordance with the required number of connection parts and the required current density.

Modified Example

Figure 21:
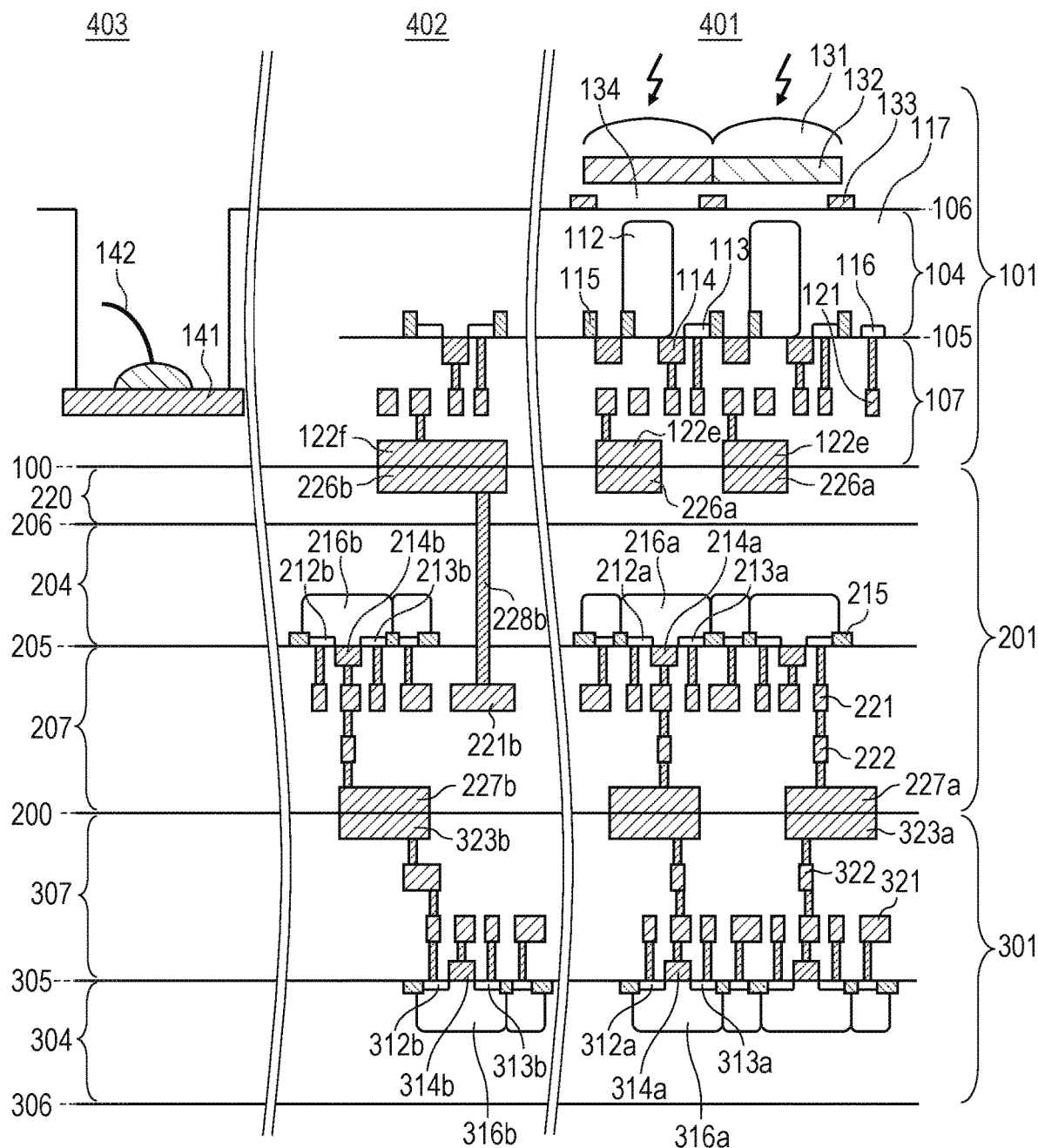
FIG. 21 is a sectional view of a photoelectric conversion device according to the second embodiment.

FIG. 21 is a sectional view of the photoelectric conversion device according to the present embodiment, which is a modified example of the form illustrated in FIG. 19 to FIG. 20B. The present modified example and the form described above are the same in that the first chip 101, the second chip 201, and the third chip 301 are stacked.

In FIG. 21, a fifth wiring structure 220 is disposed to the backside face 206 side of the second semiconductor layer 204. That is, the fifth wiring structure 220 is a wiring structure disposed between the first wiring structure 107 and the second semiconductor layer 204. Therefore, as the positional relationship, the second wiring structure 207 in FIG. 19 and the fifth wiring structure 220 in FIG. 21 are equivalent. The fifth wiring structure 220 is formed of an insulating layer and a wiring layer.

A wiring 226a is disposed in the photoelectric conversion region 401, and a wiring 226b is disposed in the peripheral region 402. At the junction interface 100, the wiring 226a is in contact with the wiring 122e of the first wiring structure 107. Further, at the junction interface 100, the wiring 226b is in contact with the wiring 122f of the first wiring structure 107. The wiring 226b of the fifth wiring structure 220 is electrically connected to the wiring 221b of the second wiring structure 207 via a through electrode 228b. In the present example, the second wiring structure 207 is disposed between the second semiconductor layer 204 and the third wiring structure 307. Therefore, as the positional relationship, the fourth wiring structure 210 in FIG. 19 and the second wiring structure 207 in FIG. 21 are equivalent.

Further, in FIG. 19 to FIG. 21, with respect to connection parts of the first chip 101 and the second chip 210, an example in which the area of the connection part of the photoelectric conversion region is smaller than the area of the connection part of the peripheral region has been described. On the contrary, however, the area of the connection part of the photoelectric conversion region may be larger than the area of the connection part of the peripheral region. The advantage obtained by such a configuration is the same as the advantage described in the first embodiment and the examples described above. According to the present embodiment, in the photoelectric conversion device in which a plurality of semiconductor layers are stacked, a photoelectric conversion device with further improved characteristics can be disposed.

Eleventh Example

Figure 22:
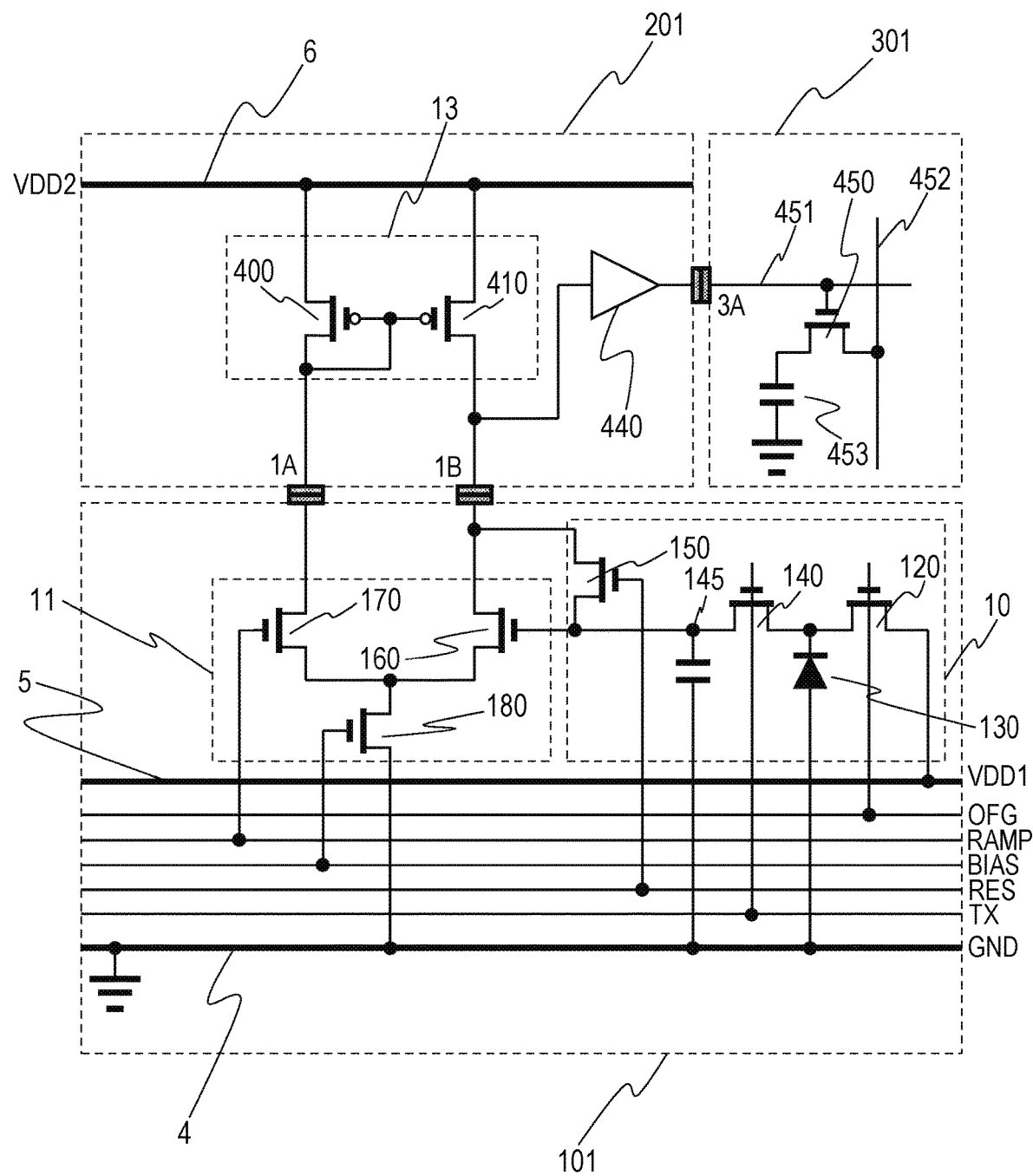
FIG. 22 is an equivalent circuit diagram of the photoelectric conversion device according to an eleventh example.

FIG. 22 is an equivalent circuit diagram related to a photoelectric conversion device according to the second embodiment. Compared to FIG. 9, the third chip 301 having a memory for additionally recording digital data is disposed. Specifically, a Dynamic Random Access Memory (DRAM) is disposed as a memory device. In FIG. 22, a transistor 450 is connected to a capacitor 453, and a word line 451 is connected to the gate of the transistor 450. Further, the drain of the transistor 450 is connected to a bit line 452, and writing to or readout from the capacitor 453 is performed by changing the voltages of the word line 451 and the bit line 452. Further, compared to FIG. 9, there is also a difference in FIG. 22 that an output from the current mirror circuit 13 of the second chip is input to an amplifier unit 440.

In FIG. 22, as with FIG. 9, the differential-pair circuit 11 is disposed to the first chip 101, and the current mirror circuit 13 is disposed to the second chip 201. Further, the connection parts 1A and 1B between chips are disposed between the differential-pair circuit 11 and the current mirror circuit 13. The connection parts 1A and 1B correspond to the connection parts formed of the wiring 122a and the wiring 223a in FIG. 19 and correspond to the connection parts formed of the wiring 122e and the wiring 226a in FIG. 21.

Further, in FIG. 22, a connection part 3A is disposed between the word line 451 disposed to the third chip 301 and the amplifier unit 440 disposed to the second chip 201. The connection part 3A corresponds to the connection part formed of the wiring 225a and the wiring 323a in FIG. 19 and corresponds to the connection part formed of a wiring 227a and the wiring 323a in FIG. 21.

Each of the areas of the connection parts 1A and 1B is preferably smaller than the area of a connection part disposed in the peripheral region 402. Alternatively, each of the areas of the connection parts 1A and 1B is preferably smaller than the area of the connection part 3A. Such a configuration has an advantage of no excessive load being disposed on the pixel output.

Third Embodiment: Imaging System

An imaging system according to the present embodiment will be described by using FIG. 23. FIG. 23 is a block diagram illustrating the general configuration of the imaging system according to the present embodiment.

The photoelectric conversion devices described in the above embodiments are applicable to various imaging systems. While an applicable imaging system is not particularly limited and may be various devices such as a digital still camera, a digital camcorder, a surveillance camera, a copy machine, a fax machine, a mobile phone, an on-vehicle camera, an observation satellite, a medical camera, or the like, for example. Further, a camera module having an optical system such as lenses and a photoelectric conversion device is also included in the imaging system. FIG. 23 illustrates a block diagram of a digital still camera as an example of the above devices.

An imaging system 500 has a photoelectric conversion device 1000, an imaging optical system 502, a CPU 510, a lens control unit 512, an imaging device control unit 514, an image processing unit 516, an aperture shutter control unit 518, a display unit 520, an operating switch 522, and a storage medium 524.

The imaging optical system 502 is an optical system used for forming an optical image of a subject and includes a lens group and an aperture 504 or the like. The aperture 504 has a function of light amount adjustment at the time of capturing by adjusting the aperture diameter and, in addition, a function as a shutter used for exposure second adjustment when capturing a static image. The lens group and the aperture 504 are held so as to be retractable along the optical axis direction, and a magnification function (zoom function) or a focus adjustment function is implemented by the interlocking operation thereof. The imaging optical system 502 may be integrated with the imaging system or may be an image capturing lens that can be attached to the imaging system.

A photoelectric conversion device 1000 is arranged in an image space of the imaging optical system 502 so that the image capturing plane is located therein. The photoelectric conversion device 1000 is a photoelectric conversion device described in the first embodiment and the second embodiment. The photoelectric conversion device 1000 photoelectrically converts a subject image captured by the imaging optical system 502 and outputs the subject image as an image signal or a focus detection signal.

The lens control unit 512 is used to control forward and backward driving of the lens group of the imaging optical system 502 to perform magnification operation or focus adjustment and is formed of a circuit or a processing device configured to implement such a function. The aperture shutter control unit 518 changes the aperture diameter of the aperture 504 (changes an aperture value) to adjust a capturing light amount and is formed of a circuit or a processing device configured to implement such a function.

The CPU 510 is a control device inside a camera that is responsible for various control of the camera unit and includes a calculation unit, a ROM, a RAM, an analog-to-digital (A/D) converter, a digital-to-analog (D/A) converter, a communication interface circuit, or the like. The CPU 510 controls the operation of each unit within the camera in accordance with a computer program stored in the ROM or the like and performs a series of capturing operations such as AF including detection of a focus state (focus detection) of the imaging optical system 502, capturing, image processing, storage, and the like. The CPU 510 is also a signal processing unit.

The imaging device control unit 514 is for controlling the operation of the photoelectric conversion device 1000, performing A/D conversion on a signal output from the photoelectric conversion device 1000, and transmitting the converted digital signal to the CPU 510 and is formed of a circuit or a control device configured to implement such a function. The A/D conversion function may be disposed in the photoelectric conversion device 1000. The image processing unit 516 is for performing image processing such as gamma conversion, color interpolation, or the like on the signal obtained after A/D conversion to generate an image signal and is formed of a circuit and a control device configured to implement such a function. The display unit 520 displays information on a capturing mode of the camera, a preview image before capturing, a review image after capturing, a focusing state at focus detection, or the like. The operating switch 522 is formed of a power source switch, a release (capturing trigger) switch, a zoom operation switch, a capturing mode selection switch, or the like. The storage medium 524 is for storing captured images or the like, which may be built in the imaging system or may be removable such as a memory card.

The imaging system 500 to which the photoelectric conversion device 1000 described in the above embodiments is applied is configured in such a way, and thereby a high-performance imaging system can be realized.

Fourth Embodiment: Imaging System and Moving Unit

Figure 24A:
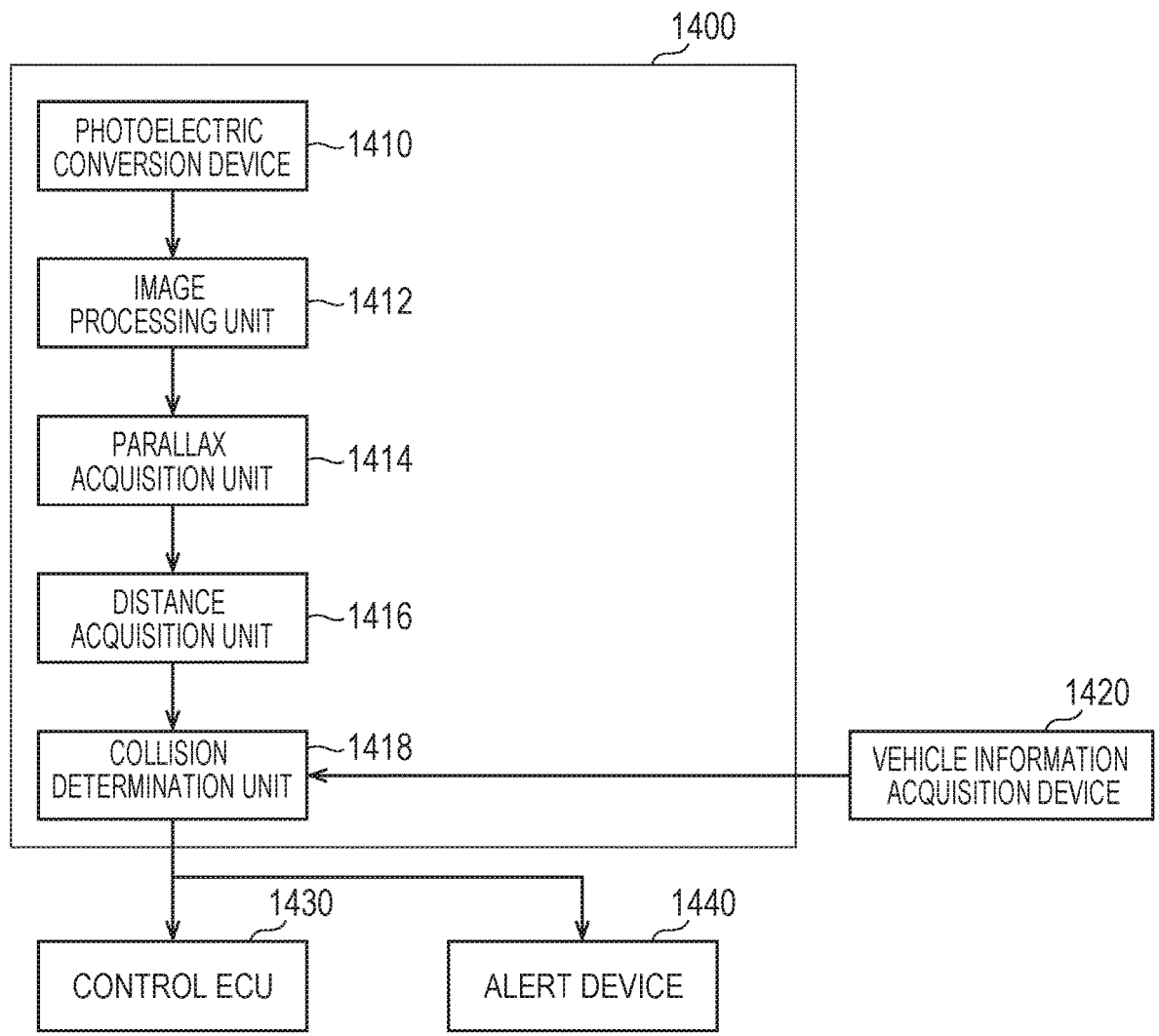
FIG. 24A is a configuration diagram of an imaging system according to a fourth embodiment.
Figure 24B:
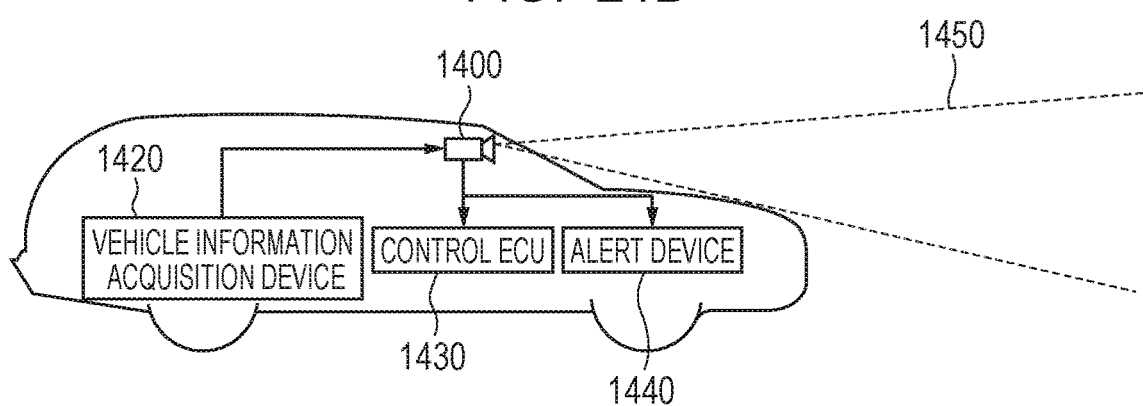
FIG. 24B is a configuration diagram of a moving unit according to the fourth embodiment.

An imaging system and a moving unit according to the present embodiment will be described by using FIG. 24A and FIG. 24B. FIG. 24A and FIG. 24B are diagrams illustrating the configuration of the imaging system and the moving unit according to the present embodiment.

FIG. 24A illustrates an example of an imaging system 1400 related to an on-vehicle camera. The imaging system 1400 has a photoelectric conversion device 1410. The photoelectric conversion device 1410 is any of the photoelectric conversion devices described in the above embodiments. The imaging system 1400 has an image processing unit 1412 that is a processing device configured to perform image processing on a plurality of image data acquired by the photoelectric conversion device 1410. Further, the imaging system 1400 has a parallax acquisition unit 1414 that is a processing device configured to calculate a parallax from the plurality of image data acquired by the photoelectric conversion device 1410. Further, the imaging system 1400 has a distance acquisition unit 1416 that is a processing device configured to calculate a distance to an object based on the calculated parallax and a collision determination unit 1418 that is a processing device configured to determine whether or not there is a collision possibility based on the calculated distance. Here, the parallax acquisition unit 1414 or the distance acquisition unit 1416 is an example of a distance information acquisition unit that acquires information such as distance information on the distance to an object. That is, the distance information is information on a parallax, a defocus amount, a distance to an object, or the like. The collision determination unit 1418 may use any of the distance information to determine the collision possibility. Each processing device described above may be implemented by dedicatedly designed hardware or may be implemented by general purpose hardware that performs calculation based on a software module. Further, the processing device may be implemented by a Field Programmable Gate Array (FPGA), an Application Specific Integrated Circuit (ASIC), or the like or may be implemented by a combination thereof.

The imaging system 1400 is connected to a vehicle information acquisition device 1420 and can acquire vehicle information such as a vehicle speed, a yaw rate, a steering angle, or the like. Further, the imaging system 1400 is connected to a control ECU 1430, which is a control device that outputs a control signal for causing a vehicle to generate braking force based on a determination result by the collision determination unit 1418. That is, the control ECU 1430 is an example of a moving-unit control unit for controlling a moving unit based on the distance information. Further, the imaging system 1400 is also connected to an alert device 1440 that issues an alert to the driver based on a determination result by the collision determination unit 1418. For example, when the collision probability is high as the determination result of the collision determination unit 1418, the control ECU 1430 performs vehicle control to avoid a collision or reduce damage by applying a brake, pushing back an accelerator, suppressing engine power, or the like. The alert device 1440 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 1400. FIG. 24B illustrates the imaging system 1400 in a case of capturing a front area of a vehicle (a capturing region 1450). The vehicle information acquisition device 1420 transmits instructions to cause the imaging system 1400 to operate and perform capturing. When the photoelectric conversion device described in the above embodiments is used as the photoelectric conversion device 1410, the imaging system 1400 of the present embodiment can further improve the ranging accuracy. Further, the vehicle may be controlled based on image recognition without performing ranging.

Although an example of control for avoiding a collision to another vehicle has been described in the description above, it is applicable to automatic driving control for following another vehicle, automatic driving control for not going out of a traffic lane, or the like. Furthermore, the imaging system is not limited to a vehicle such as the subject vehicle and can be applied to a moving unit (transport apparatus) such as a ship, an airplane, or an industrial robot, for example. A moving apparatus in the moving unit (transport apparatus) may be various units used for motion, such as an engine, a motor, a wheel, a propeller, or the like. In addition, the imaging system can be widely applied to a device which utilizes object recognition, such as an intelligent transportation system (ITS), without being limited to moving units.

In addition, the embodiments and the examples described above can be replaced with each other within a scope satisfying the principle of the solution to the problem of the disclosure.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-022022, filed Feb. 9, 2018, which is hereby incorporated by reference herein in its entirety.

What is claimed is:
1. A photoelectric conversion device comprising:
a first semiconductor layer in which a plurality of photoelectric conversion units are disposed;
a second semiconductor layer in which a signal processing circuit that processes a signal output from the plurality of photoelectric conversion units is disposed;
a first wiring structure disposed between the first semiconductor layer and the second semiconductor layer; and
a second wiring structure disposed between the first wiring structure and the second semiconductor layer,
wherein, in a photoelectric conversion region in which the plurality of photoelectric conversion units are disposed, a first connection part included in the first wiring structure and a second connection part included in the second wiring structure are in contact with each other at a junction interface of the first wiring structure and the second wiring structure,
wherein, in a peripheral region disposed between the photoelectric conversion region and a pad region where a pad electrode is arranged in a planar view, a third connection part included in the first wiring structure and a fourth connection part included in the second wiring structure are in contact with each other at the junction interface, the peripheral region including a transistor configured to transmit a pulse signal used for driving a pixel transistor arranged in the photoelectric conversion region,
wherein the third connection part and the fourth connection part are electrically connected to a power source line or a drive line of a transistor disposed in the photoelectric conversion region of the first semiconductor layer, and
wherein an area of at least one of the first connection part and the second connection part is different from an area of at least one of the third connection part and the fourth connection part in the planar view.

2. The photoelectric conversion device according to claim 1, wherein the area of at least one of the first connection part and the second connection part is smaller than the area of at least one of the third connection part and the fourth connection part.

3. The photoelectric conversion device according to claim 2, wherein the third connection part and the fourth connection part are electrically connected to the power source line of the transistor.

4. The photoelectric conversion device according to claim 2, wherein the third connection part and the fourth connection part are electrically connected to the drive line of the transistor.

5. The photoelectric conversion device according to claim 2 further comprising:
a first input node of a comparator in the first semiconductor layer; and
an output node of the comparator in the second semiconductor layer, wherein the first input node is a node to which a signal based on signal charges generated by each of the photoelectric conversion units is input, and wherein the first connection part and the second connection part are disposed between the first input node of the comparator and the output node of the comparator.

6. The photoelectric conversion device according to claim 2 further comprising: a first input node and an output node of the comparator in the second semiconductor layer, wherein the first input node is a node to which a signal based on signal charges generated by each of the photoelectric conversion units in input, and wherein the first connection part and the second connection part are disposed between the first input node of the comparator and each of the photoelectric conversion units.

7. The photoelectric conversion device according to claim 1, wherein the area of at least one of the first connection part and the second connection part is larger than the area of at least one of the third connection part and the fourth connection part.

8. The photoelectric conversion device according to claim 1 further comprising:

a third semiconductor layer;

a third wiring structure disposed between the second semiconductor layer and the third semiconductor layer; and a fourth wiring structure disposed between the third wiring structure and the second semiconductor layer, wherein, in the photoelectric conversion region, a seventh connection part included in the third wiring structure and an eighth connection part included in the fourth wiring structure are in contact with each other at a junction interface between the third wiring structure and the fourth wiring structure.

9. The photoelectric conversion device according to claim 8, wherein an area of at least one of the seventh connection part and the eighth connection part is different from an area of the first connection part or the second connection part.

10. The photoelectric conversion device according to claim 8, wherein an area of at least one of the seventh connection part and the eighth connection part is smaller than an area of the first connection part or the second connection part.

11. The photoelectric conversion device according to claim 8, wherein a memory that stores output from the second semiconductor layer is disposed in the third semiconductor layer.

12. An imaging system comprising:

the photoelectric conversion device according to claim 1; and a processing device that processes a signal output from the photoelectric conversion device.

13. A moving unit comprising:

the photoelectric conversion device according to claim 1;

a moving apparatus;

a processing device that acquires information from a signal output from the photoelectric conversion device; and a control device that controls the moving apparatus based on the information.

14. The photoelectric conversion device according to claim 1, wherein the pad electrode and the third connection part are not overlapped in the planar view.

15. The photoelectric conversion device according to claim 1, wherein, at the junction interface, the area of at least one of the first connection part and the second connection part is different from an area of at least one of the third connection part and the fourth connection part in the planar view.

16. A photoelectric conversion device comprising:

a first semiconductor layer in which a plurality of photoelectric conversion units are disposed;

a second semiconductor layer in which a signal processing circuit that processes a signal output from the plurality of photoelectric conversion units is disposed;

a first wiring structure disposed between the first semiconductor layer and the second semiconductor layer; and a second wiring structure disposed between the first wiring structure and the second semiconductor layer, wherein, in a photoelectric conversion region in which the plurality of photoelectric conversion units are disposed, a first connection part included in the first wiring structure and a second connection part included in the second wiring structure are in contact with each other at a junction interface of the first wiring structure and the second wiring structure, and a fifth connection part included in the first wiring structure and a sixth connection part included in the second wiring structure are in contact with each other at the junction interface, and wherein an area of at least one of the first connection part and the second connection part is smaller than an area of at least one of the fifth connection part and the sixth connection part.

17. The photoelectric conversion device according to claim 16 further comprising:

a first input node of a comparator in the first semiconductor layer; and an output node of the comparator in the second semiconductor layer, wherein the first input node is a node to which a signal based on signal charges generated by each of the photoelectric conversion units is input, and wherein the first connection part and the second connection part are disposed between the first input node of the comparator and the output node of the comparator.

18. The photoelectric conversion device according to claim 16 further comprising: a first input node and an output node of the comparator in the second semiconductor layer, wherein the first input node is a node to which a signal based on signal charges generated by each of the photoelectric conversion units is input, and wherein the first connection part and the second connection part are disposed between the first input node of the comparator and each of the photoelectric conversion units.

19. The photoelectric conversion device according to claim 16, wherein a transistor is disposed in the photoelectric conversion region of the first semiconductor layer, and wherein the fifth connection part and the sixth connection part are electrically connected to a power source line of the transistor.

20. The photoelectric conversion device according to claim 16, wherein a transistor is disposed in the photoelectric conversion region of the first semiconductor layer, and wherein the fifth connection part and the sixth connection part are electrically connected to a drive line of the transistor.

21. An imaging system comprising:
the photoelectric conversion device according to claim 16; and
a processing device that processes a signal output from the photoelectric conversion device.

22. A moving unit comprising:
the photoelectric conversion device according to claim 16;
a moving apparatus;
a processing device that acquires information from a signal output from the photoelectric conversion device; and
a control device that controls the moving apparatus based on the information.

23. The photoelectric conversion device according to claim 16,
wherein, at the junction interface, the area of at least one of the first connection part and the second connection part is smaller than the area of at least one of the fifth connection part and the sixth connection part.

* * * * *